(12) United States Patent
Choi et al.

(10) Patent No.: US 11,018,210 B2
(45) Date of Patent: *May 25, 2021

(54) DISPLAY DEVICE

(71) Applicant: SAMSUNG DISPLAY CO., LTD., Yongin-si (KR)

(72) Inventors: Jonghyun Choi, Yongin-si (KR); Kinyeng Kang, Yongin-si (KR); Sunkwang Kim, Yongin-si (KR); Joosun Yoon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/019,152

(22) Filed: Sep. 11, 2020

(65) Prior Publication Data

US 2020/0411616 A1   Dec. 31, 2020

Related U.S. Application Data

(63) Continuation of application No. 16/389,658, filed on Apr. 19, 2019, now Pat. No. 10,777,626, which is a
(Continued)

(30) Foreign Application Priority Data

Dec. 4, 2015   (KR) .................. 10-2015-0172663

(51) Int. Cl.
*H01L 27/32* (2006.01)
*G09G 3/20* (2006.01)
(Continued)

(52) U.S. Cl.
CPC ........... *H01L 27/3246* (2013.01); *G09G 3/20* (2013.01); *G09G 3/3225* (2013.01); *H01L 21/28* (2013.01);
(Continued)

(58) Field of Classification Search
None
See application file for complete search history.

(56) References Cited

U.S. PATENT DOCUMENTS 5,740,130 A * 4/1998 Grupp ............... G02F 1/133553
349/113
6,626,721 B1 * 9/2003 Van Slyke .......... H01L 27/3283
313/504
(Continued)

FOREIGN PATENT DOCUMENTS

CN    101086567 A    12/2007
CN    101187769 A    5/2008
(Continued)

OTHER PUBLICATIONS

EPO Partial Search Report dated Apr. 21, 2017, for corresponding European Patent Application No. 16184050.9 (13 pages).
(Continued)

*Primary Examiner* — Lex H Malsawma
(74) *Attorney, Agent, or Firm* — Lewis Roca Rothgerber Christie LLP

(57) ABSTRACT

A display device includes a substrate including a first surface, and a second surface opposite the first surface, and defining a through portion passing therethrough, a pixel array including a plurality of pixels surrounding the through portion at the first surface, a plurality of scan lines extending along a first direction for providing scan signals to the pixels, and a plurality of data lines extending along a second direction crossing the first direction for providing data signals to the pixels, the plurality of data lines including first and second data lines adjacent the through portion at different layers, and having at least a portion thereof curved along a perimeter of the through portion.

20 Claims, 24 Drawing Sheets

Related U.S. Application Data continuation of application No. 15/217,802, filed on Jul. 22, 2016, now Pat. No. 10,304,913.

(51) Int. Cl.
  *G09G 3/3225* (2016.01)
  *H01L 21/28* (2006.01)
  *H01L 51/52* (2006.01)
  *G04C 17/00* (2006.01)

(52) U.S. Cl.
  CPC ...... *H01L 51/5237* (2013.01); *G04C 17/0091* (2013.01); *G09G 2300/0426* (2013.01); *G09G 2300/0439* (2013.01); *G09G 2300/0465* (2013.01); *G09G 2320/0209* (2013.01); *G09G 2320/0223* (2013.01); *H01L 51/5253* (2013.01)

(56) References Cited

U.S. PATENT DOCUMENTS

| | | | |
|---|---|---|---|
| 7,630,122 B2 * | 12/2009 | Uchida | G02F 1/16755 359/296 |
| 7,656,471 B2 | 2/2010 | Ota et al. | |
| 7,830,591 B2 | 11/2010 | Shimodaira | |
| 7,885,497 B2 | 2/2011 | Wu et al. | |
| 8,237,906 B2 | 8/2012 | Igeta et al. | |
| 8,350,792 B2 | 1/2013 | Igeta et al. | |
| 8,890,181 B2 | 11/2014 | Wang et al. | |
| 9,853,096 B1 | 12/2017 | Choi et al. | |
| 10,304,913 B2 * | 5/2019 | Choi | H01L 27/3276 |
| 10,777,626 B2 * | 9/2020 | Choi | H01L 27/3276 |
| 2004/0051451 A1 * | 3/2004 | Kawase | H05B 33/04 313/512 |
| 2006/0244893 A1 | 11/2006 | Oda | |
| 2008/0117497 A1 | 5/2008 | Shimodaira | |
| 2008/0203907 A1 | 8/2008 | Lee et al. | |
| 2008/0225216 A1 | 9/2008 | Shimodaira | |
| 2009/0051636 A1 | 2/2009 | Natori | |
| 2012/0224125 A1 | 9/2012 | Son et al. | |
| 2014/0133282 A1 | 5/2014 | Hamm | |
| 2014/0332769 A1 | 11/2014 | Lee et al. | |
| 2014/0354700 A1 | 12/2014 | Hong | |
| 2015/0021708 A1 | 1/2015 | Lin et al. | |
| 2015/0048331 A1 | 2/2015 | Kwack et al. | |
| 2015/0060786 A1 | 3/2015 | Kwak | |
| 2015/0108482 A1 | 4/2015 | Kim | |
| 2015/0144934 A1 | 5/2015 | Rappoport et al. | |
| 2015/0160767 A1 | 6/2015 | Song et al. | |
| 2015/0255523 A1 | 9/2015 | Her | |
| 2015/0311232 A1 | 10/2015 | Sun et al. | |
| 2016/0377828 A1 | 12/2016 | Ito | |
| 2017/0033173 A1 | 2/2017 | Kim | |

FOREIGN PATENT DOCUMENTS

| | | |
|---|---|---|
| CN | 103472646 A | 12/2013 |
| EP | 1923738 A2 | 5/2008 |
| EP | 2317492 A1 | 5/2011 |
| JP | 2000-250049 A | 9/2000 |
| JP | 2003-167241 A | 6/2003 |
| JP | 2004-329687 A | 11/2004 |
| JP | 2008-096809 A | 4/2008 |
| JP | 2008-233606 A | 10/2008 |
| JP | 2008-257191 A | 10/2008 |
| JP | 4176225 B2 | 11/2008 |
| JP | 2009-218181 A | 9/2009 |
| JP | 2010-066461 A | 3/2010 |
| JP | 2010-139657 A | 6/2010 |
| JP | 2010-164765 A | 7/2010 |
| JP | 2010-197740 A | 9/2010 |
| JP | 2014-96355 A | 5/2014 |
| KR | 10-2014-0141378 A | 12/2014 |
| KR | 10-2015-0019717 A | 2/2015 |
| KR | 10-2015-0080304 A | 7/2015 |
| KR | 10-2015-0105586 A | 9/2015 |
| WO | WO 2015/141264 A1 | 9/2015 |

OTHER PUBLICATIONS

EPO Extended Search Report dated Oct. 11, 2017, for corresponding European Patent Application No. 16184050.9 (15 pages).

* cited by examiner

DISPLAY DEVICE

CROSS-REFERENCE TO RELATED APPLICATION(S)

This application is a continuation of U.S. patent application Ser. No. 16/389,658, filed Apr. 19, 2019, now U.S. Pat. No. 10,777,626, which is a continuation of U.S. patent application Ser. No. 15/217,802, filed Jul. 22, 2016, now U.S. Pat. No. 10,304,913, which claims priority to and the benefit of Korean Patent Application No. 10-2015-0172663, filed Dec. 4, 2015, 10 the entire content of all of which is incorporated herein by reference

BACKGROUND

1. Field

One or more embodiments relate to a display device.

2. Description of the Related Art

Recently, the purpose of display devices has been diversified. Also, as display devices become thin and lightweight, a range of use of display devices gradually extends. Particularly, recently, manufacture of display devices as a flat panel display devices has been researched.

Various methods may be used in designing the form of the display device. Also, functions that may be combined with, or connected to, the display device increase.

SUMMARY

One or more embodiments include a display device having a through portion.

Additional aspects will be set forth in part in the description that follows and, in part, will be apparent from the description, or may be learned by practice of the presented embodiments.

According to one or more embodiments, a display device includes a substrate including a first surface, and a second surface opposite the first surface, and defining a through portion passing therethrough, a pixel array including a plurality of pixels surrounding the through portion at the first surface, a plurality of scan lines extending along a first direction for providing scan signals to the pixels, and a plurality of data lines extending along a second direction crossing the first direction for providing data signals to the pixels, the plurality of data lines including first and second data lines adjacent the through portion at different layers, and having at least a portion thereof curved along a perimeter of the through portion.

The first data line might not overlap the second data line.

The substrate may include a display area corresponding to the pixels, and a non-display area adjacent the display area.

The non-display area may include a first non-display area surrounded by the display area, and surrounding the through portion, and a second non-display area surrounding the display area.

One of the first and second data lines may be connected with a connection data line, the connection data line includes a same material as an other of the first and second data line is located.

At least one of the first and second data lines may include a first straight line portion extending along the second direction, a curved portion connected with the first straight line portion, and a second straight line portion connected with the curved portion, and extending along the second direction.

The curved portion may be integral with the first and second straight lines at a same layer.

The device may further include an insulating layer between the curved portion and the first or second straight line portions, the curved portion may be at a different layer than the first or second straight line portions, the curved portion and the first straight line portion may contact each other via a first contact passing through the insulating layer, and the curved portion and the second straight line portion may contact each other via a second contact passing through the insulating layer.

The device may further include a thin film encapsulation layer including an inorganic layer and an organic layer above the substrate.

The thin film encapsulation layer may include a lateral surface defining the through portion.

The thin film encapsulation layer may include a first inorganic layer, an organic layer above the first inorganic layer, and a second inorganic layer above the organic layer.

The device may further include a dam adjacent the through portion at the first surface of the substrate.

The dam may be located between an end of the organic layer and the through portion.

The first inorganic layer and the second inorganic layer may contact each other at a contact portion, and may extend further toward the through portion than the organic layer.

The device may further include an inorganic insulating layer below the first data line and the second data line, and directly contacting the first inorganic layer adjacent the through portion.

The device may further include an inorganic passivation layer above the first data line and the second data line, and directly contacting the first inorganic layer adjacent the through portion.

At least one of the first and second data lines may overlap the contact portion.

The device may further include a passivation layer including an organic-inorganic composite particle above the first and second data lines, and directly contacting the first inorganic layer adjacent the through portion.

At least one of the first and second data lines may overlap the contact portion.

The plurality of pixels may include a first pixel and a second pixel arranged along the second direction, spaced from each other with the through portion therebetween, and electrically connected with one of the first and second data lines.

The plurality of data lines may further include a third data line including a same material as one of the first and second data lines, and spaced from the through portion along the first direction, and the plurality of pixels may further include a third pixel electrically connected with the third data line, and including a pixel electrode, an emission layer above the pixel electrode, and an opposite electrode above the emission layer.

At least one of the first and second data line may overlap the pixel electrode of the third pixel.

Each of the pixels may include a pixel circuit including a transistor and a storage capacitor, and an organic light-emitting diode electrically connected with the pixel circuit.

According to the above, embodiments provide a display device that reduces an area of a first non-display area around a through portion surrounded by pixels, and that improves sealing performance.

BRIEF DESCRIPTION OF THE DRAWINGS

These and/or other aspects will become apparent and more readily appreciated from the following description of the exemplary embodiments, taken in conjunction with the accompanying drawings, in which.

DETAILED DESCRIPTION

Figure 1:
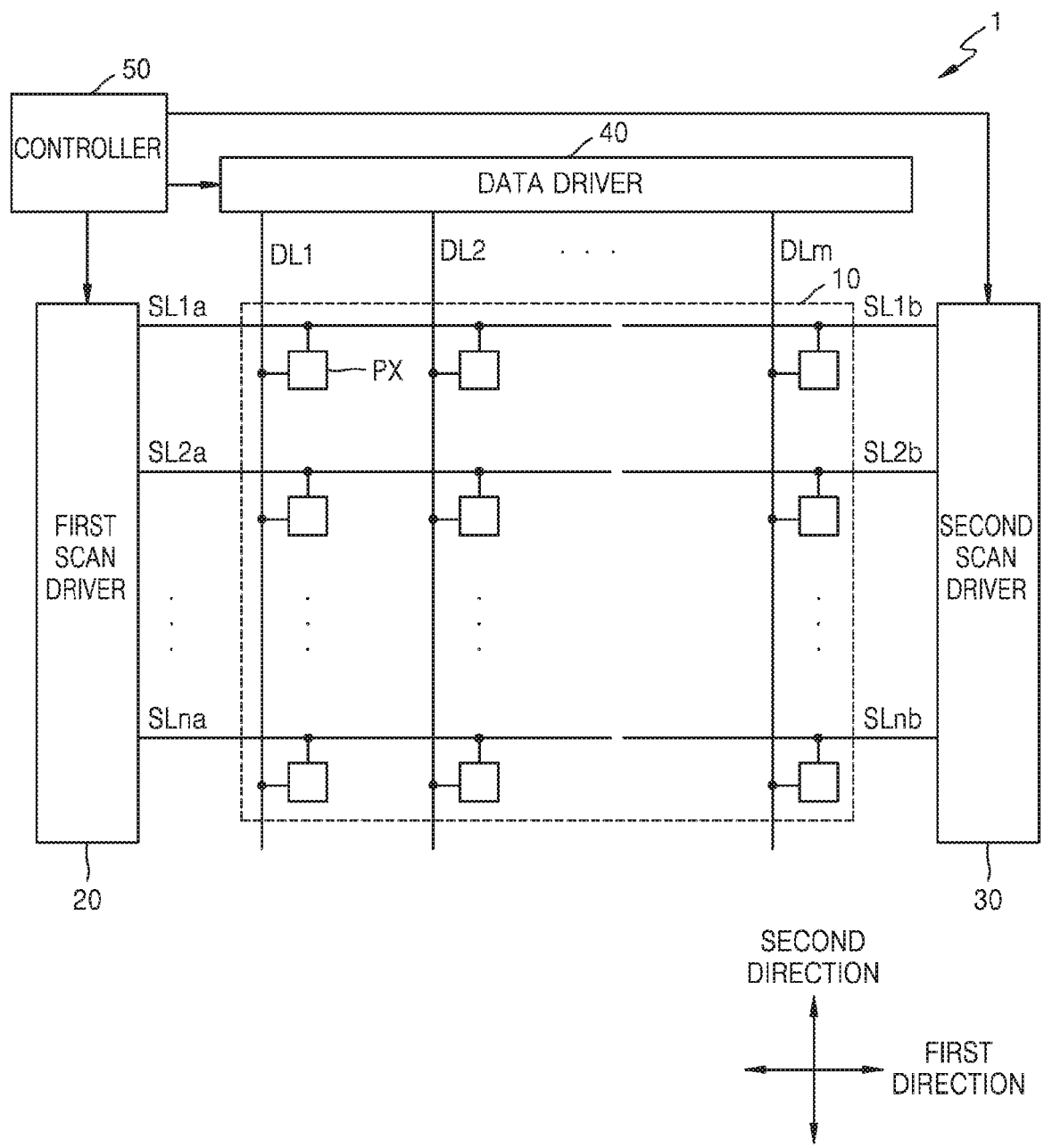
FIG. 1 is a block diagram illustrating a display device according to an embodiment.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described.

Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram illustrating a display device 1 according to an embodiment.

Referring to FIG. 1, the display device 1 is an active type organic light-emitting display device, and includes a pixel array 10, a first scan driver 20, a second scan driver 30, and a data driver 40. Each pixel PX includes a pixel circuit, and an organic light-emitting diode (OLED) connected to the pixel circuit.

The pixel array 10 includes a plurality of pixels PX located at intersections of a plurality of scan lines SL1a to SLna and SL1b to SLnb, and a plurality of data lines DL1 to DLm, the pixels PX being arranged in a matrix configuration. In the present embodiment, the plurality of scan lines SL1a to SLna and SL1b to SLnb extend in a first direction, which is a row direction, and the plurality of data lines DL1 to DLm extend in a second direction, which is a column direction.

Each pixel PX is connected to one of the plurality of scan lines SL1a to SLna and SL1b to SLnb transferred to the pixel array 10. Although each pixel PX is connected to one scan line corresponding to a relevant pixel row in FIG. 1, the inventive concept is not limited thereto. In another embodiment, each pixel PX may be connected to two scan lines.

The first scan driver 20 and the second scan driver 30 may be at opposite sides of the pixel array 10, and may perform dual scanning. For example, the first scan driver 20 generates a scan signal, and transfers the scan signal to some of the pixels PX, and the second scan driver 30 generates a scan signal, and transfers the scan signal to others of the pixels PX. The first scan driver 20 and the second scan driver 30 may be synchronized by a synchronized clock signal.

The data driver 40 transfers data signals to respective pixels PX via the plurality of data lines DL1 to DLm.

A controller 50 changes a plurality of externally generated image signals into a plurality of image data signals, and transfers the plurality of image data signals to the data driver 40. The controller 50 receives a synchronization signal, and a clock signal, generates control signals for controlling driving of the data driver 40 and the first and second scan drivers 20 and 30, and transfers the control signals to the data driver 40 and the first and second scan drivers 20 and 30.

Each pixel PX emits light having brightness (e.g., predetermined brightness) by using a driving current supplied to the OLED according to a data signal provided via a corresponding one of the data lines DL1 to DLm.

Figure 2:
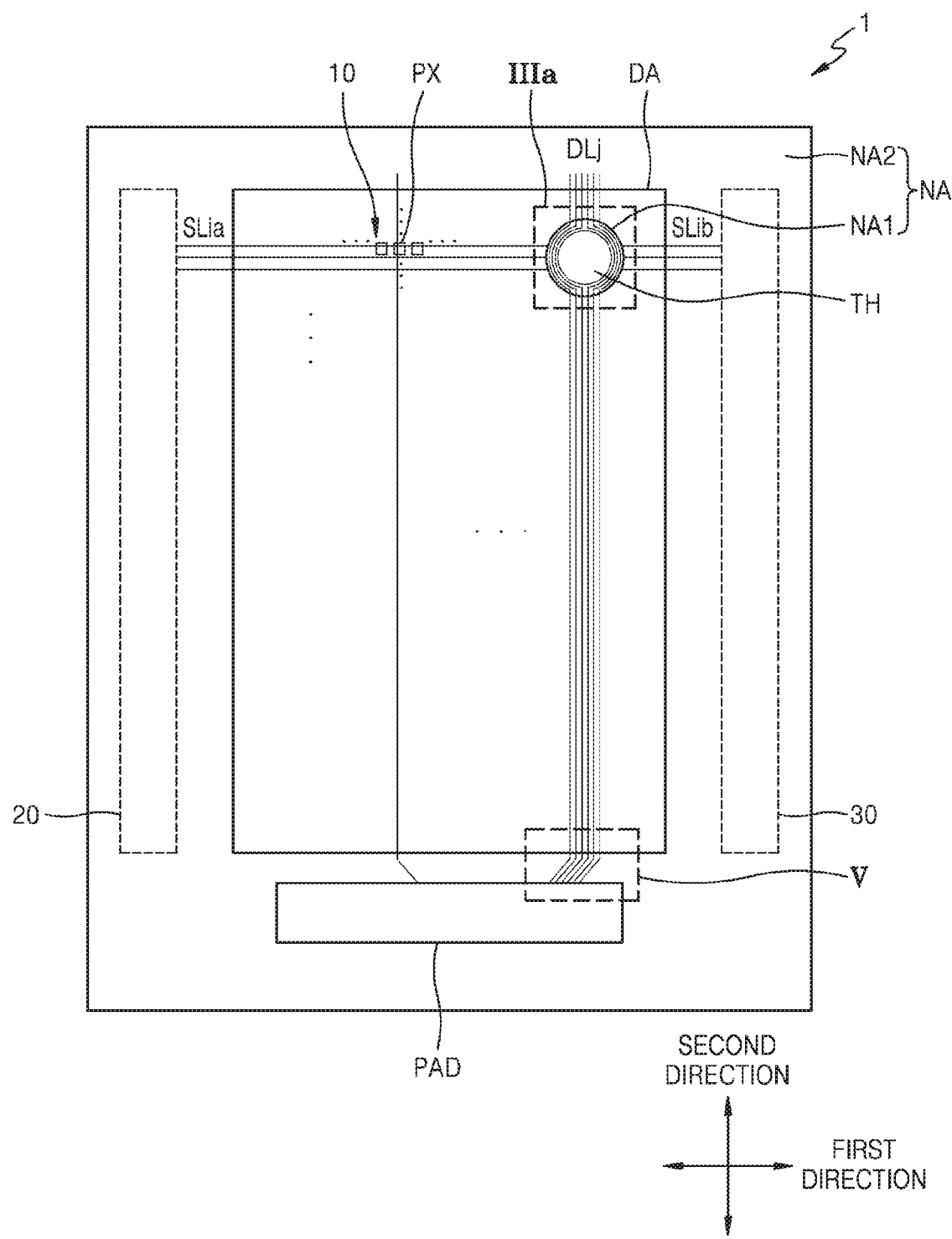
FIG. 2 is a plan view illustrating a display device according to an embodiment.

FIG. 2 is a plan view illustrating a display device according to an embodiment.

Referring to FIG. 2, a substrate 100 includes a display area DA and a non-display area NA.

The display area DA is a region in which the pixel array 10 is located, and an image (e.g., a predetermined image) is provided by using light emitted by a plurality of pixels PX in the display area DA.

The substrate 100 includes a through hole (through portion) TH passing through the substrate 100. The through hole TH is surrounded by a plurality of pixels PX.

The non-display area NA includes a first non-display area NA1 and a second non-display area NA2. The first non-display area NA1 surrounds the outline of the through hole TH, and corresponds to a region between the through hole TH and pixels PX adjacent the through hole TH. The first non-display area NA1 is surrounded by the display area DA. The second non-display area NA2 surrounds the outline of the display area DA. The first non-display area NA1 is separated from the second non-display area NA2 by a portion of the display area DA.

The first and second scan drivers 20 and 30 are in the second non-display area NA2. The first and second scan drivers 20 and 30 are spaced apart from each other with the pixel array 10 of the display area DA therebetween. A scan signal generated from the first scan driver 20 is provided to some of the pixels PX via scan lines SLia (i=1, 2, . . . , n), and a scan signal generated from the second scan driver 30 is provided to some of the pixels PX via scan lines SLib (i=1, 2, . . . , n).

A pad portion PAD is located in the second non-display area NA2. The data driver 40 (see FIG. 1) may be mounted in a form of an integrated circuit (IC) above the pad portion PAD. Data signals generated by the data driver 40 are provided to respective pixels PX via data lines DLj (j=1, 2, . . . , m).

Although FIG. 2 illustrates a case where the through hole TH is formed in the upper right portion of the display device 1, the inventive concept is not limited thereto. The through hole TH may be located in the display device 1, may be surrounded by pixels PX, and a specific location thereof is not limited.

Although FIG. 2 illustrates a case where the through hole TH has a circular shape, and where only one through hole TH is formed, the inventive concept is not limited thereto. The through hole TH may have various shapes, including a polygon, such as a quadrangle, or an ellipse, and a number of the through holes TH is not limited.

Similarly, although FIG. 2 illustrates a case where the first non-display area NA1 surrounding the through hole TH has a circular shape according to the shape of the through hole TH, the inventive concept is not limited thereto. The first non-display area NA1 may have various shapes, including a polygon, such as a quadrangle, or an ellipse, and is not limited thereto.

Although FIG. 2 illustrates a case where the display area DA has a quadrangular shape, the inventive concept is not limited thereto. The display area DA may have various shapes, including a polygon, such as a triangle and a pentagon, or a circle or an ellipse.

Figure 3A:
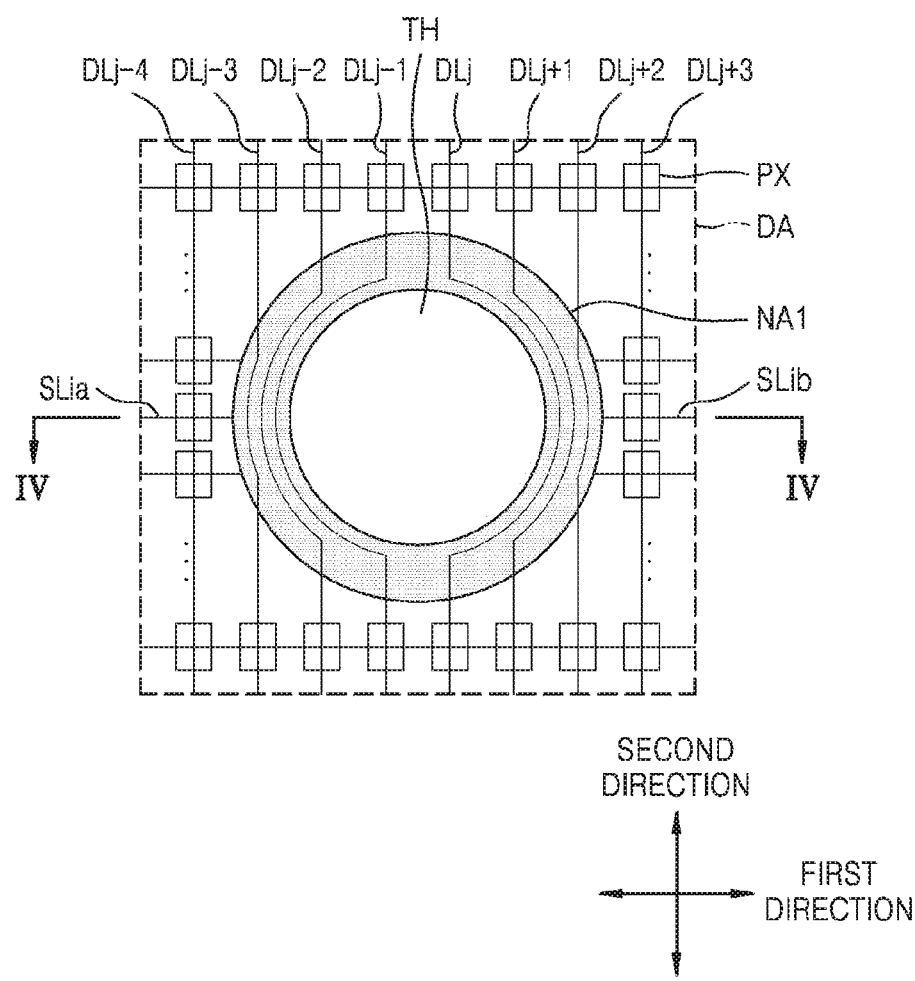
FIG. 3A is a plan view enlarging the portion IIIa of FIG. 2.
Figure 3B:
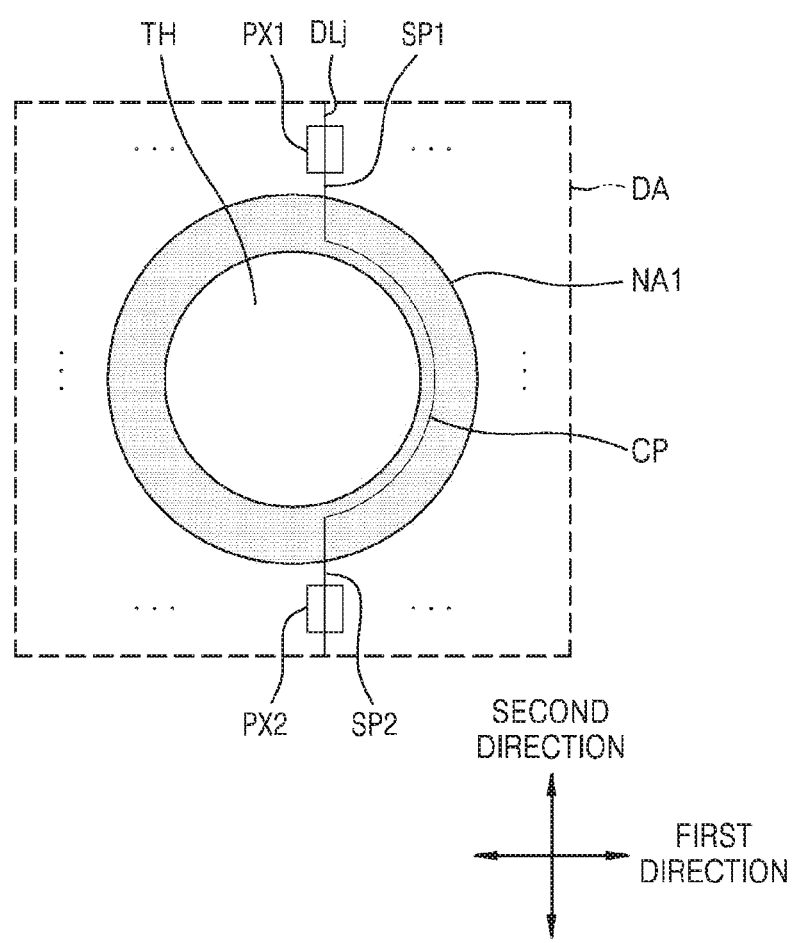
FIG. 3B is a plan view depicting a portion of FIG. 3A.
Figure 3C:
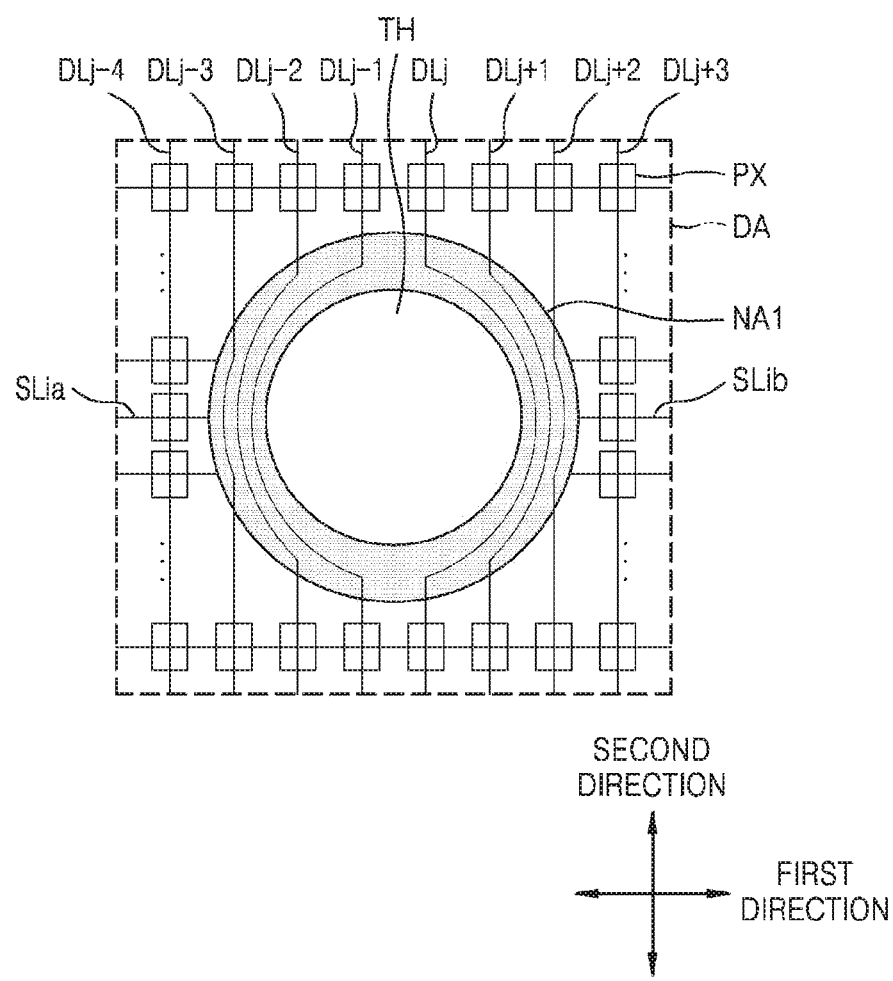
FIG. 3C is a plan view according to a modified embodiment of FIG. 3A.
Figure 4:
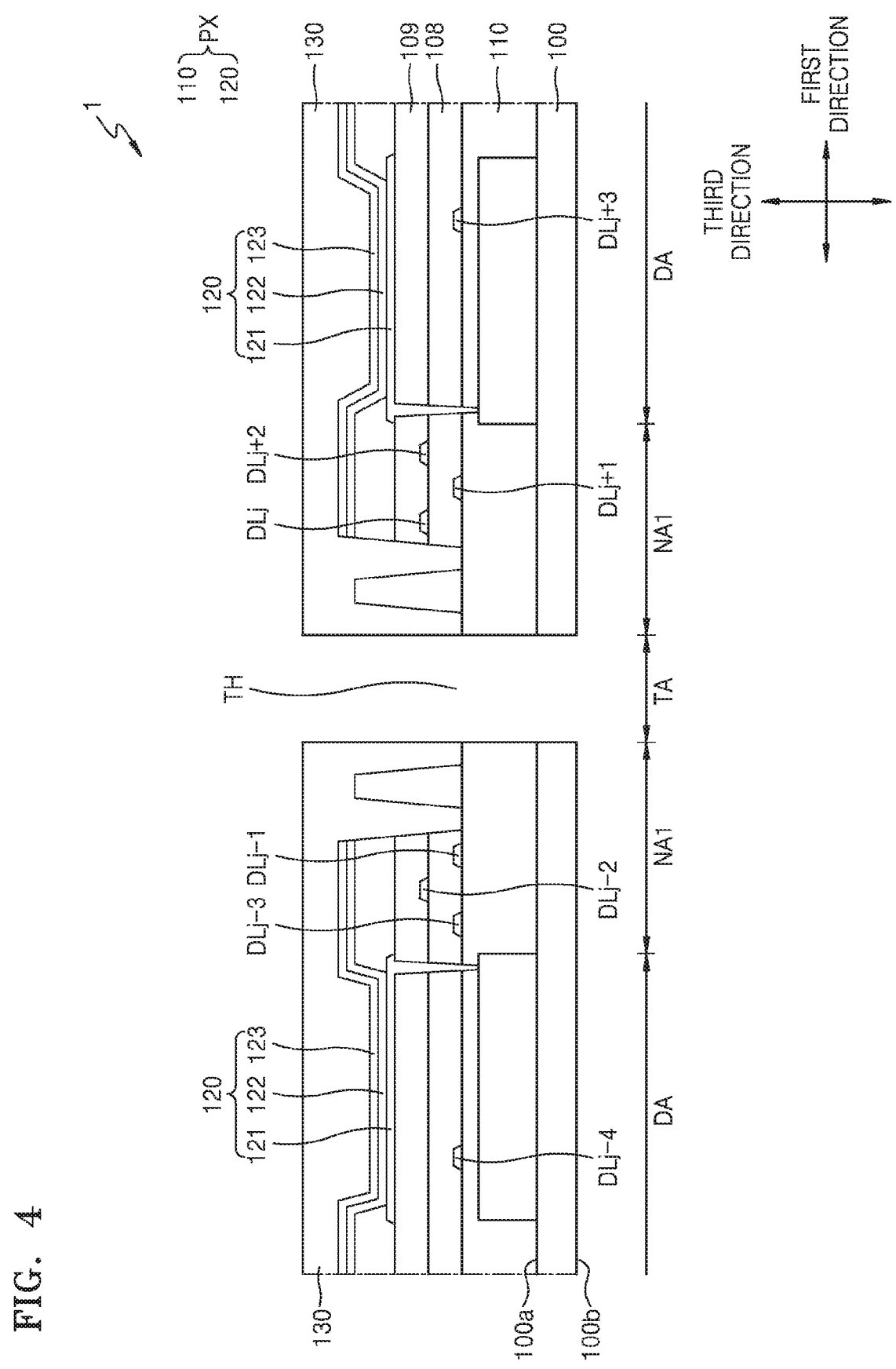
FIG. 4 is a cross-sectional view taken along the line IV-IV of FIG. 3A.
Figure 5:
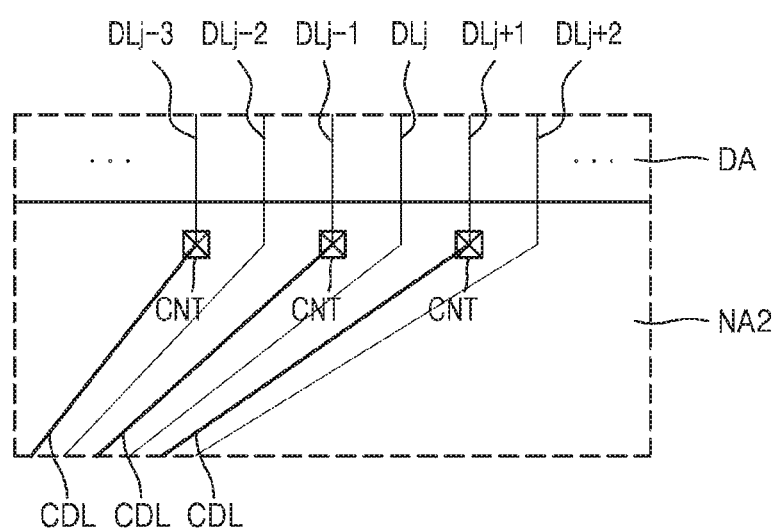
FIG. 5 is a plan view enlarging the portion V of FIG. 2.

FIG. 3A is a plan view enlarging the portion IIIa of FIG. 2, FIG. 3B is a plan view depicting a portion of FIG. 3A, FIG. 3C is a plan view illustrating a modified embodiment of FIG. 3A, FIG. 4 is a cross-sectional view taken along the line IV-IV of FIG. 3A, and FIG. 5 is a plan view enlarging the portion V of FIG. 2.

Referring to FIG. 3A, a plurality of pixels PX are around the through hole TH, and respective pixels PX are connected with a respective one of the scan lines SLia or SLib (i=1, 2, . . . , n) and a respective one of the data lines DLj (j=1, 2, . . . , m) to receive a scan signal and a data signal.

The plurality of scan lines SLia and SLib (i=1, 2, . . . , n) extend in the first direction, and a scan line SLia or SLib extending toward the through hole TH may be disconnected (or cut) around the through hole TH (e.g., may terminate near the through hole TH due to the presence thereof). A portion of a scan line SLia cut around the through hole TH that is located to the left of the through hole TH receives a scan signal from the first scan driver 20 (see FIG. 2), and transfers the received scan signal to a relevant pixel PX, and a portion of a scan line SLib cut around the through hole TH that is located to the right of the through hole TH receives a scan signal, and/or may receive an emission control signal, from the second scan driver 30 (see FIG. 2), and transfers the received signal(s) to a relevant pixel PX.

Some data lines DLj−3 to DLj+2 from among a plurality of data lines DLj (j=1, 2, . . . , m) extend in the second direction, and are curved along the outline of the through hole TH at one side thereof in the first non-display area NA1. Other data lines DL1, . . . , DLj−4, DLj+3, . . . , DLm are spaced apart from the through hole TH, and extend in the second direction in the display area DA.

The other data lines DL1, . . . , DLj−4, DLj+3, . . . , DLm spaced apart from the through hole TH extend in a straight line along the second direction, and provide a data signal to pixels PX of a relevant pixel column. The data lines DLj−3 to DLj+2 curved along the through hole TH provide a data signal to respective pixels PX on opposite sides of the through hole TH along the second direction.

For example, as illustrated in FIG. 3B, of pixels PX spaced from each other along the second direction with the through hole TH therebetween, a first pixel PX1 and a second pixel PX2 respectively on the upper side and the lower side of the through hole TH receive a data signal via the curved data line DLj. The curved data line DLj includes a first straight portion/straight line portion SP1, a curved portion CP connected with the first straight line portion SP1 and curved in the first non-display area NA1, and a second straight portion/straight line portion SP2 connected with the curved portion CP. The first straight line portion SP1, the curved portion CP, and the second straight line portion SP2 may be integrally formed at the same layer. Although FIG. 3 describes one curved data line DLj, other data lines DLj−3 to DLj−1, DLj+1, and DLj+2 curved along the through hole TH may have the same or similar shape.

Although FIGS. 3A and 3B illustrate a case where the curved data lines DLj−3 to DLj+2 are curved with the same curvature, the inventive concept is not limited thereto. In another embodiment, as illustrated in FIG. 3C, the curved data lines DLj−3 to DLj+2 may have different curvatures.

Referring to FIGS. 3A and 4, pixels PX are around the through hole TH, which passes through the substrate 100, are above a first surface 100*a* of the substrate 100, and are sealed by a thin film encapsulation layer 130.

The substrate 100 may include a material, such as glass, metal, or an organic material. According to an embodiment, the substrate 100 may include a flexible material. For example, the substrate 100 may include a material such as polyimide (PI), which may be warped, bent, or rolled, but this is exemplary and an embodiment is not limited thereto.

A plurality of pixels PX are located in the display area DA of the substrate 100. Each pixel PX includes a pixel circuit 110, and an OLED 120 that is electrically connected with the pixel circuit 110. The OLED 120 includes a pixel electrode 121 above a planarization layer 109, an opposite electrode 123, and an intermediate layer 122 therebetween that includes an organic emission layer. The planarization layer 109 includes an organic material.

The non-display area NA1 of the substrate 100 surrounds a through area TA corresponding to the through hole TH. The data lines DLj−3 to DLj+2 are located in the first non-display area NA1. As described with reference to FIGS. 3A and 3B, the data lines DLj−3 to DLj+2 provide a data signal to pixels PX located above and below the through hole TH (in a plan view), and are curved in the first non-display area NA1 (in a plan view).

Some of the curved data lines DLj−3 to DLj+2 are located in different layers. The curved data lines DLj−3 to DLj+2 may be alternately above and below an organic passivation layer 108. Because the curved data lines DLj−3 to DLj+2 are alternately located at different layers, a pitch between the data lines DLj−3 to DLj+2 may be reduced, so that an occupying ratio of (e.g., the overall size of) the first non-display area NA1 in the substrate 100 may be reduced.

To reduce parasitic capacitance occurring therebetween, the data lines DLj−3 to DLj+2 located at different layers might not overlap each other.

A thin film encapsulation layer 130 is above the display area DA and the first non-display area NA1 of the substrate 100. The thin film encapsulation layer 130 may prevent penetration of external oxygen and moisture into pixels PX and various wirings including the data lines DLj.

The thin film encapsulation layer 130 may entirely cover the display area DA and the first non-display area NA1 of the substrate 100, and may form a lateral surface that defines the through hole TH.

Referring to FIGS. 2, 4, and 5, the data lines DLj−3, DLj−1, and DLj+1 located below the organic passivation layer 108, which are from among the data lines that are alternately located at different layers, may be connected to a connection data line CDL (e.g., a respective connection data line CDL). A contact CNT (e.g., a respective contact CNT) between the data lines DLj−3, DLj−1, DLj+1 and the connection data line CDL may be located in the second non-display area NA2. The connection data line CDL located in the second non-display area NA2 may serve as a link line connecting a data driver mounted in the pad portion PAD with the data lines DLj−3, DLj−1, and DLj+1.

Although the present embodiment illustrates a case where the contact CNT between the data lines DLj−3, DLj−1, DLj+1 and the connection data line CDL is located in the second non-display area NA2, the inventive concept is not limited thereto. In another embodiment, the contact CNT may be located in the first non-display area NA1 or the display area DA.

Although FIG. 5 illustrates a case where the data lines DLj−3, DLj−1, and DLj+1 located below the organic passivation layer 108 from among the data lines DLj−3 to DLj+2 located in different layers may be connected to a connection data line CDL, the present embodiment is not limited thereto. Alternatively, the connection data line CDL may be connected with the data lines DLj−2, DLj and DLj+2 located above the organic passivation layer 108.

Figure 6:
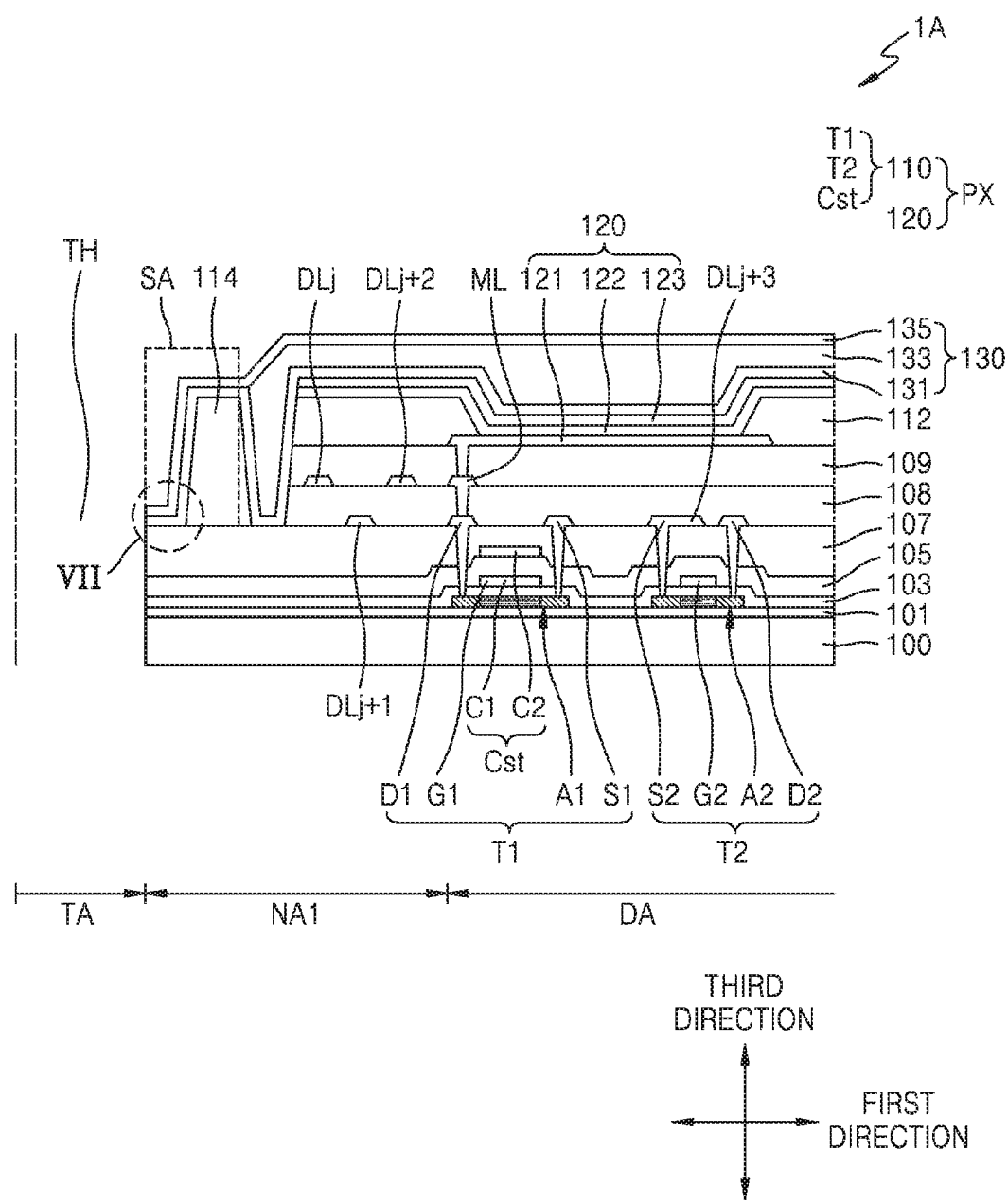
FIG. 6 is a cross-sectional view illustrating a portion of a display device according to another embodiment.
Figure 7:
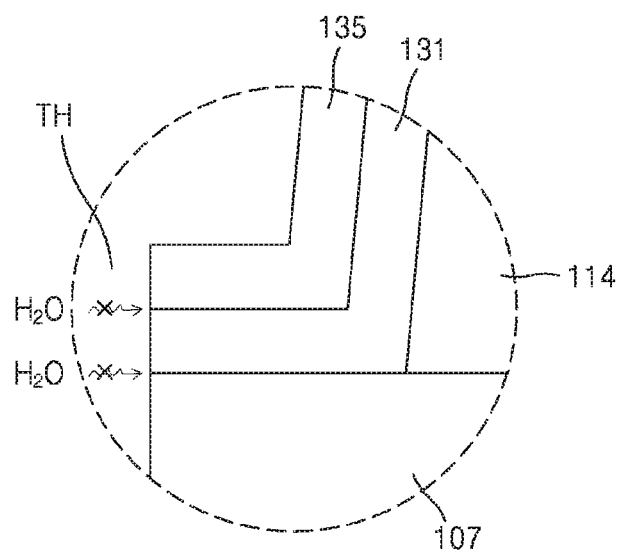
FIG. 7 is an enlarged view illustrating the portion VII of FIG. 6.

FIG. 6 is a cross-sectional view illustrating a portion of a display device 1A according to another embodiment, and FIG. 7 is an enlarged view illustrating the portion VII of FIG. 6. In the display device 1A of FIG. 6, like the display device 1 as described above with reference to FIG. 4, pixels PX on both sides of a through hole TH have the same structure. Therefore, for convenience of description, FIG. 6 extracts and illustrates the right side of the through hole TH of the display device 1A.

Referring to FIG. 6, a pixel PX including a pixel circuit 110, which includes a first thin film transistor T1, a second thin film transistor T2, and a storage capacitor Cst, and including the OLED 120 electrically connected with the pixel circuit 110, is formed in a display area DA.

A buffer layer 101 is above the substrate 100. The buffer layer 101 may reduce or block penetration of foreign substances, moisture, or external air from below the substrate 100, and may provide a planarized surface. The buffer layer 101 may include an inorganic material, such as an oxide or a nitride, and may include a single layer or multi layers including an inorganic material.

The first thin film transistor T1 is a driving thin film transistor, and includes an active layer A1, a gate electrode G1, a source electrode S1, and a drain electrode D1. The second thin film transistor T2 is a switching thin film transistor, and includes an active layer A2, a gate electrode G2, a source electrode S2, and a drain electrode D2. The source electrode S2 of the second thin film transistor T2 is connected with the data line DLj+3. Although the present embodiment illustrates the top-gate type thin film transistors in which the gate electrodes G1 and G2 are respectively above the active layers A1 and A2 with a gate insulating layer 103 therebetween, the first and second thin film transistors T1 and T2 may instead be bottom-gate type thin film transistors, according to another embodiment.

The active layers A1 and A2 may include amorphous silicon or polycrystalline silicon. According to another embodiment, the active layers A1 and A2 may include an oxide of at least one of In, Ga, Sn, Zr, V, Hf, Cd, Ge, Cr, Ti, and/or Zn.

The gate electrodes G1 and G2 may include a low resistance metallic material. For example, the gate electrodes G1 and G2 may include a conductive material including Mo, Al, Cu, Ti, etc., and may include multi layers or a single layer including the above material.

The gate insulating layer 103 may include an inorganic material including an oxide or a nitride. For example, the gate insulating layer 103 may include SiOx, SiNx, SiON, Al2O3, TiO2, Ta2O5, HfO2, ZnO2, etc.

The source electrodes S1 and S2 and the drain electrodes D1 and D2 may include a material having excellent conductivity. For example, the source electrodes S1 and S2 and the drain electrodes D1 and D2 may include a conductive material including Mo, Al, Cu, Ti, etc., and may include multi layers or a single layer including the above material. According to an embodiment, the source electrodes S1 and S2 and the drain electrodes D1 and D2 may include multi layers including Ti/Al/Ti.

The storage capacitor Cst may include a lower electrode C1 and an upper electrode C2 located in different layers, with a first interlayer insulating layer 105 therebetween, and may overlap each other. The storage capacitor Cst may overlap the first thin film transistor T1.

The lower electrode C1 of the storage capacitor Cst may be at the same layer as, or may be the same as, the gate electrode G1 of the first thin film transistor T1, and may include the same material as that of the gate electrode G1. For example, the gate electrode G1 of the first thin film transistor T1 may serve as the lower electrode C1 of the storage capacitor Cst.

The upper electrode C2 of the storage capacitor Cst is between the gate electrode G1, the source electrode S1, and the drain electrode D1 of the first thin film transistor T1. The upper electrode C2 may include a conductive material including Mo, Al, Cu, Ti, etc., and may include multi layers or a single layer including the above material. According to an embodiment, the upper electrode C2 may include multi layers including Mo/Al/Mo.

The first interlayer insulating layer 105 may include an inorganic material including an oxide or a nitride. For example, the first interlayer insulating layer 105 may include SiOx, SiNx, SiON, Al2O3, TiO2, Ta2O5, HfO2, ZnO2, etc.

A second interlayer insulating layer 107 is between the upper electrode C2 of the storage capacitor Cst and the source/drain electrodes S1, S2, D1, D2, and includes an inorganic material including an oxide or a nitride. For example, the second interlayer insulating layer 107 may include SiOx, SiNx, SiON, Al2O3, TiO2, Ta2O5, HfO2, ZnO2, etc.

The OLED 120 may be located above the planarization layer 109, and may be electrically connected with the first thin film transistor T1 by using a mediation metal ML.

The planarization layer 109 may include a general polymer, such as poly methyl methacrylate (PMMA) and poly styrene (PS), polymer derivatives having a phenol-based group, an acryl-based polymer, an imide-based polymer, an aryl ether-based polymer, an amide-based polymer, a fluorine-based polymer, a p-xylene based polymer, a vinyl alcohol-based polymer, and/or a blend of these.

The pixel electrode 121 of the OLED 120 may be a (semi) transparent electrode or a reflective electrode. The (semi) transparent electrode may include, for example, indium tin oxide (ITO), indium zinc oxide (IZO), zinc oxide (ZnO), indium oxide (In2O3), indium gallium oxide (IGO), or aluminum zinc oxide (AZO). The reflective electrode may include a reflective layer including Ag, Mg, Al, Pt, Pd, Au, Ni, Nd, Ir, Cr, and/or a compound thereof, and may further include a layer including ITO, IZO, ZnO, and/or In2O3 above the reflective layer.

The intermediate layer 122 of the OLED 120 includes an organic emission layer emitting, for example, red, green, and/or blue light. In another embodiment, the organic emission layer may emit white light. The intermediate layer 122 may further include at least one of a hole transport layer (HTL), a hole injection layer (HIL), an electron transport layer (ETL), and/or an electron injection layer (EIL).

The opposite electrode 123 of the OLED 120 may be a reflective electrode or a (semi) transparent electrode. The reflective electrode may include at least one of, for example, Li, Ca, LiF/Ca, LiF/Al, Al, Ag, and/or Mg. The (semi) transparent electrode may include a layer including Li, Ca, LiF/Ca, LiF/Al, Al, Ag, Mg, and/or a compound thereof, and may further include a layer including a (semi) transparent material, such as ITO, IZO, ZnO, In2O3, etc., above the layer. Although not shown, a capping layer may additionally be above the opposite electrode 123.

As described with reference to FIGS. 2 to 4, the data lines DLj to DLj+2 curved along the outline (e.g., circumference, or perimeter) of the through hole TH are in the first non-display area NA1. Because respective ones of the data lines DLj to DLj+2 are in different layers with the organic passivation layer 108 therebetween, a pitch between adjacent data lines may be reduced, and thus the area of the first non-display area NA1 may also be reduced, as described above.

The organic passivation layer 108 may include a general polymer such as poly methyl methacrylate (PMMA) and poly styrene (PS), polymer derivatives having a phenol-based group, an acryl-based polymer, an imide-based polymer, an aryl ether-based polymer, an amide-based polymer, a fluorine-based polymer, a p-xylene based polymer, a vinyl alcohol-based polymer, and/or a blend of these.

A dam 114 is located in the first non-display area NA1 of the substrate 100. The dam 114 prevents an organic material from flowing toward the through hole TH during a process of forming an organic layer 133 of thin film encapsulation layer 130.

The dam 114 may include an organic material. According to an embodiment, the dam 114 may be formed by forming the organic passivation layer 108, the planarization layer 109, and a pixel-defining layer 112, and then patterning a stacked structure of these layers. While the dam 114 is formed, a portion of the upper surface of the second interlayer insulating layer 107 may be exposed.

The thin film encapsulation layer 130 may entirely cover the substrate 100, and may have a structure in which an inorganic layer and an organic layer are alternately stacked. According to an embodiment, the thin film encapsulation layer 130 may include a first inorganic layer 131, an organic layer 133, and a second inorganic layer 135 sequentially stacked.

The first inorganic layer 131 and the second inorganic layer 135 may include a metallic oxide, a metallic nitride, a metallic carbide, and a compound thereof. For example, the first inorganic layer 131 and the second inorganic layer 135 may include at least one inorganic material from among Al2O3, TiO2, Ta2O5, HfO2, ZnO2, SiOx, AlON, AlN, SiON, and/or Si3N4.

The organic layer 133 may include a polymer-based material. Examples of the polymer-based material include an acryl-based resin, an epoxy-based resin, polyimide, polyethylene, etc. The organic layer 133 may alleviate internal stress of the first inorganic layer 131 and the second inorganic layer 135, or may supplement/correct a defect of the first inorganic layer 131 and/or the second inorganic layer 135, and planarize the first inorganic layer 131 and the second inorganic layer 135.

Because the dam 114 blocks flowing of an organic material toward the through hole TH while the organic layer 133 is formed, an end of the organic layer 133 may be located inside the dam 114 (e.g., at a region opposite to the through hole TH with respect to the dam 114).

The first inorganic layer 131 and the second inorganic layer 135 extend further toward the through hole TH than the organic layer 133. The first inorganic layer 131 and the second inorganic layer 135 directly contact each other at the outside of the dam 114 (e.g., at a region between the through hole TH and the dam 114), and may form the lateral surface defining the through hole TH. A portion where the first inorganic layer 131 and the second inorganic layer 135 directly contact each other is referred to as a contact portion SA hereinafter.

Referring to FIGS. 6 and 7, because the first inorganic layer 131 and the second inorganic layer 135 directly contact each other in a region adjacent the through hole TH, and because the first inorganic layer 131 directly contacts the second interlayer insulating layer 107 including an inorganic material, penetration of moisture along an interfacial direction between these layers 131 and 135 may be reduced or prevented.

The planarization layer 109 includes an organic material, and covers data lines DLj to DLj+2 located in the first non-display area NA1. The planarization layer 109, which is an organic material, has low moisture barrier performance. A penetration possibility of moisture is reduced via the above-described contact portion SA and contact structure between the contact portion SA and the second interlayer insulating layer 107. However, if moisture should penetrate via an interface between the planarization layer 109 and a layer that contacts the planarization layer 109, the data lines DLj to DLj+2 may be damaged.

To reduce or remove this possibility, the curved data lines DLj to DLj+2 may be inside the dam 114 in the first non-display area NA1. The data lines DLj to DLj+2 may be spaced apart from the through hole TH such that the dam 114 and the contact portion SA are located between the curved data lines DLj to DLj+2 and the through hole TH, so that the likelihood of moisture penetration may reduce even more.

Figure 8:
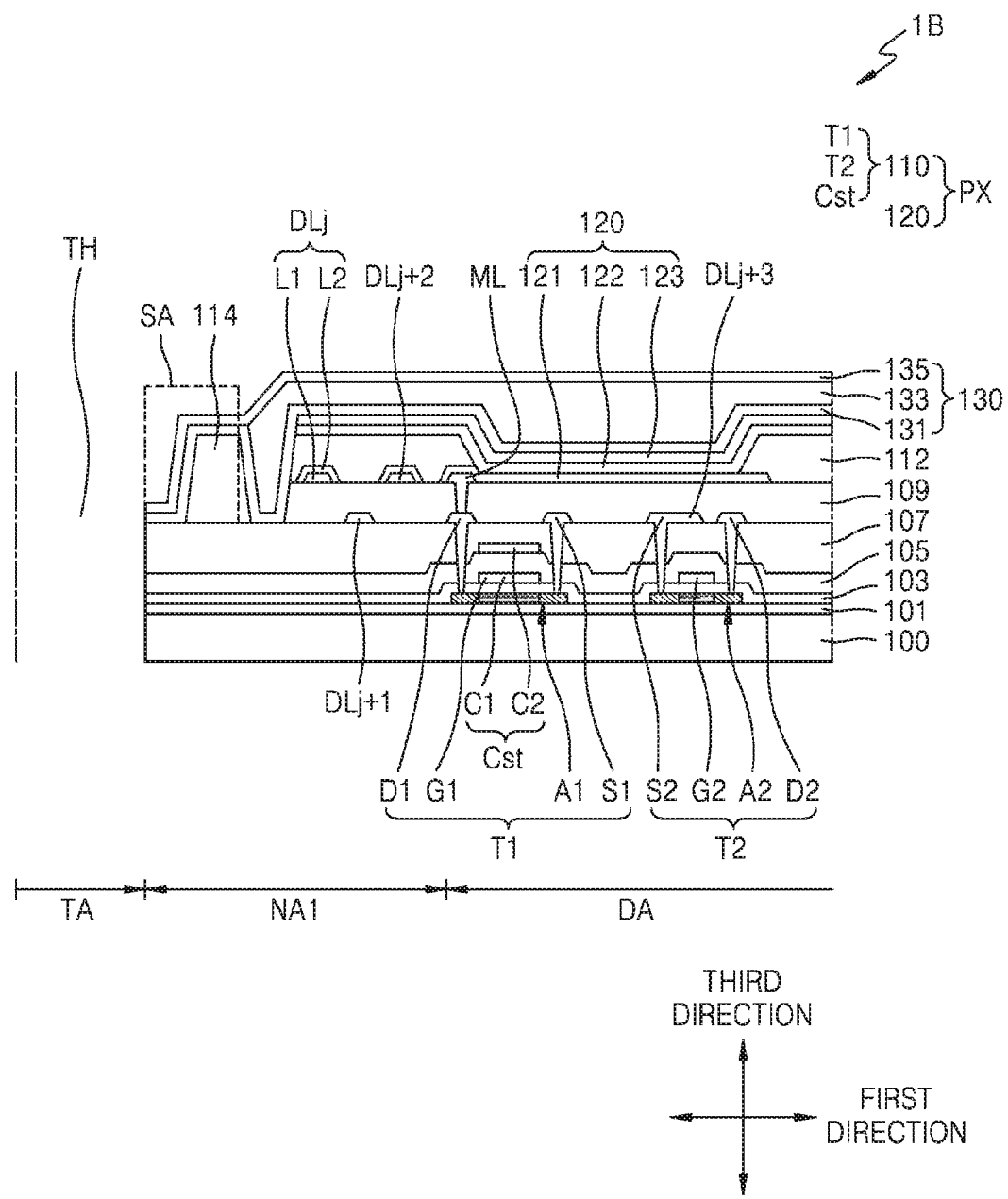
FIG. 8 is a cross-sectional view illustrating a portion of a display device according to another embodiment.

FIG. 8 is a cross-sectional view illustrating a portion of a display device 1B according to another embodiment. The display device 1B of FIG. 8 is different from the display device 1A described with reference to FIGS. 6 and 7 in that the organic passivation layer 108 between the source/drain electrodes S1, S2, D1, D2, and the pixel electrode 121 is omitted, and the structure and location of the curved data lines DLj to DLj+2 are different. For convenience of description, points different from the embodiment described with reference to FIGS. 6 and 7 are mainly described.

Referring to FIG. 8, data lines DLj to DLj+2 curved along the outline/perimeter of the through hole TH may be in the first non-display area NA1, and some data lines DLj and DLj+2 from among the data lines DLj to DLj+2 may be above the planarization layer 109, while the other data line DLj+1 of the data lines DLj to DLj+2 may be below the planarization layer 109. The pixel-defining layer 112 may cover the data lines DLj to DLj+2.

According to an embodiment, some data lines DLj and DLj+2 from among the curved data lines above the planarization layer 109 may include a first layer L1 and a second layer L2.

The first layer L1 may include the same material as a mediation metal ML. The second layer L2 may include the same material as the pixel electrode 121. The first layer L1 and the second layer L2 may include different materials, respectively.

Although the present embodiment describes a case where some data lines DLj and DLj+2 include two layers, the inventive concept is not limited thereto. In another embodiment, some data lines DLj and DLj+2 may include only the first layer L1.

The pixel-defining layer 112 includes an organic material, and covers the data lines DLj to DLj+2 located in the first non-display area NA1. The pixel-defining layer 112, which is an organic material, has low moisture barrier performance. A penetration possibility of moisture is reduced due to the contact portion SA, and due to a contact structure between the contact portion SA and the second interlayer insulating layer 107. However, if moisture should penetrate via an interface between the pixel-defining layer 112 and a layer contact the pixel-defining layer 112, the data lines DLj to DLj+2 may be damaged.

To reduce or remove this possibility, the curved data lines DLj to DLj+2 may be inside the dam 114 in the first non-display area NA1. The data lines DLj to DLj+2 may be spaced apart from the through hole TH such that the dam 114 and the contact portion SA are located between the curved data lines DLj to DLj+2 and the through hole TH, so that the penetration possibility of moisture may reduce even more.

Figure 9:
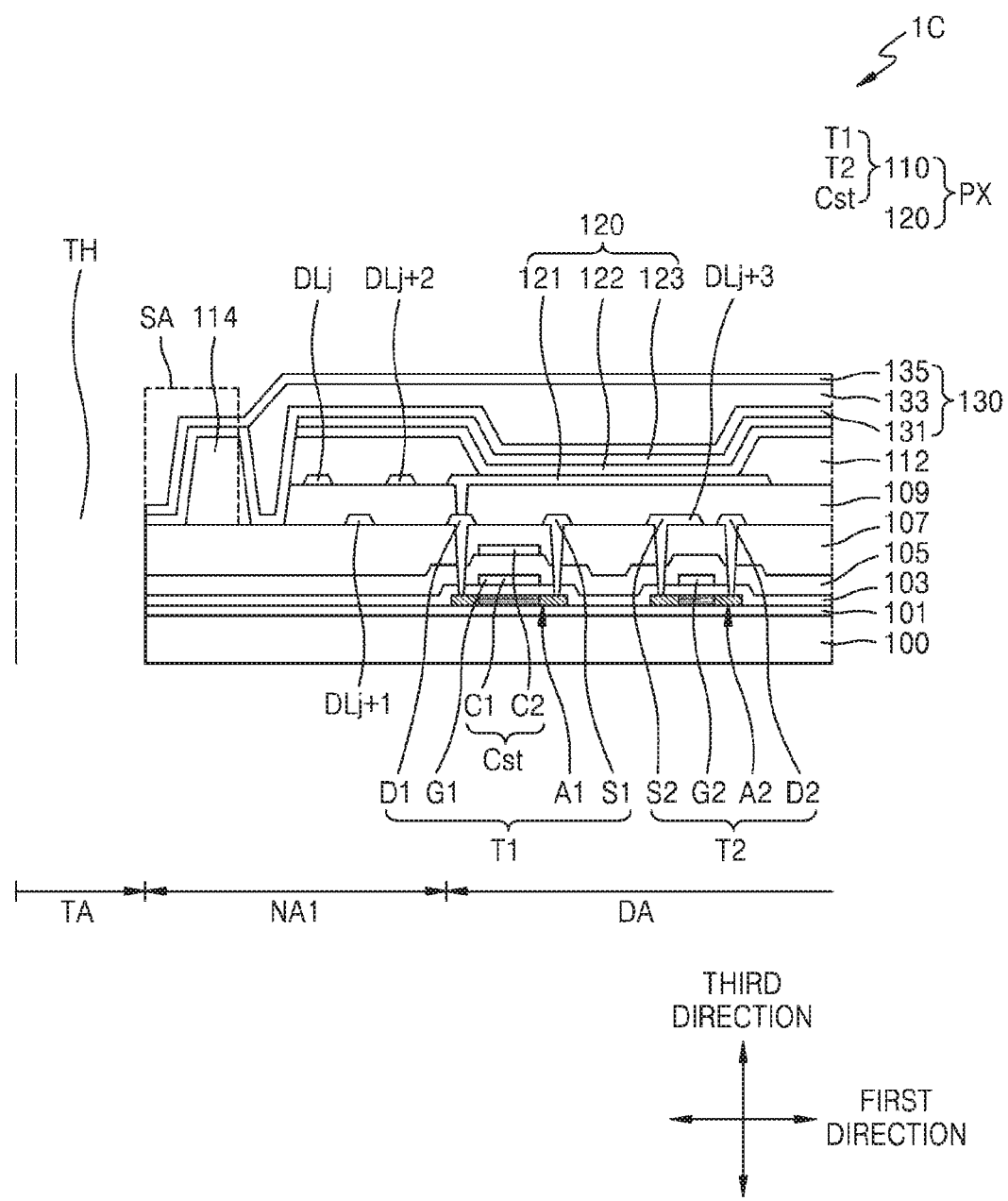
FIG. 9 is a cross-sectional view illustrating a portion of a display device according to another embodiment.

FIG. 9 is a cross-sectional view illustrating a portion of a display device 1C according to another embodiment. Compared with the display device 1B described with reference to FIG. 8, some data lines DLj and DLj+2 of the display device 1C are different. For convenience of description, points different from the embodiment described with reference to FIG. 8 are mainly described.

Referring to FIG. 9, the data lines DLj and DLj+2 located above the planarization layer 109 from among the curved data lines DLj to DLj+2 are at the same layer as the pixel electrode 121, and include the same material as the pixel electrode 121. Because some data lines DLj and DLj+2 include the same material as, and are at a same layer as, the pixel electrode 121, a number of masks may reduce during a manufacturing process.

Figure 10:
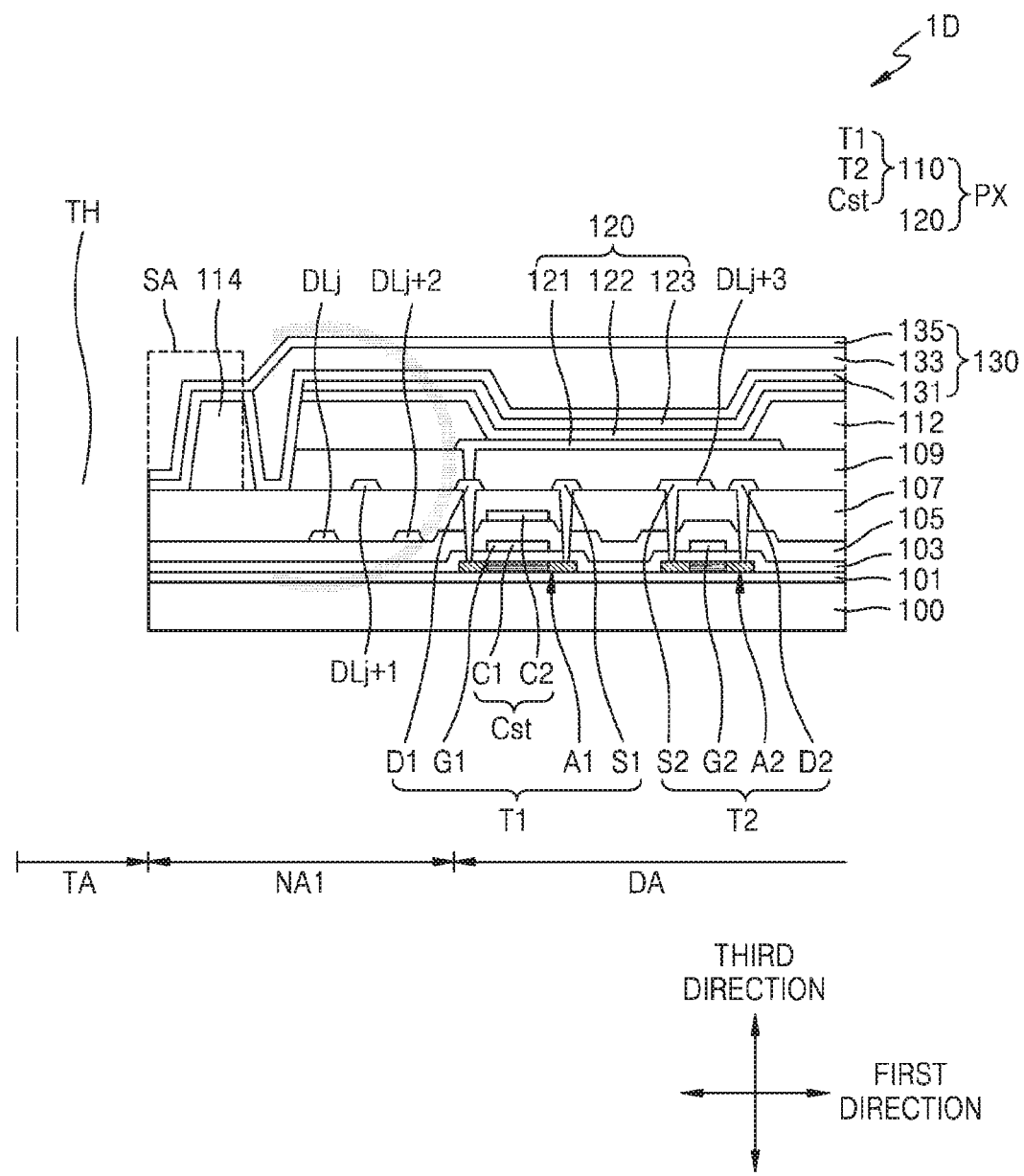
FIG. 10 is a cross-sectional view illustrating a portion of a display device according to another embodiment.

FIG. 10 is a cross-sectional view illustrating a portion of a display device 1D according to another embodiment. Compared with the display device 1A described with reference to FIGS. 6 and 7, the display device 1D of FIG. 10 is different from the display device 1A in that the organic passivation layer 108 located between the source/drain electrodes S1, S2, D1, D2, and the pixel electrode 121 is omitted, and the structure and location of the curved data lines DLj to DLj+2 are different. For convenience of description, points different from the embodiment described with reference to FIGS. 6 and 7 are mainly described.

Referring to FIG. 10, the data line DLj+1 from among the curved data lines DLj to DLj+2 may be at a same layer as the source and drain electrodes S1 and D1 of the first thin film transistor T1, and may include the same material as the source and drain electrodes S1 and D1. The other data lines DLj and DLj+2 of the data lines DLj to DLj+2 may be at a same layer as the upper electrode C2 of the storage capacitor Cst, and may include the same material as the upper electrode C2.

Because some data lines DLj and DLj+2 include the same material as, and are at the same layer as, the upper electrode C2 of the storage capacitor Cst, a number of masks may be reduced during a manufacturing process.

Figure 11:
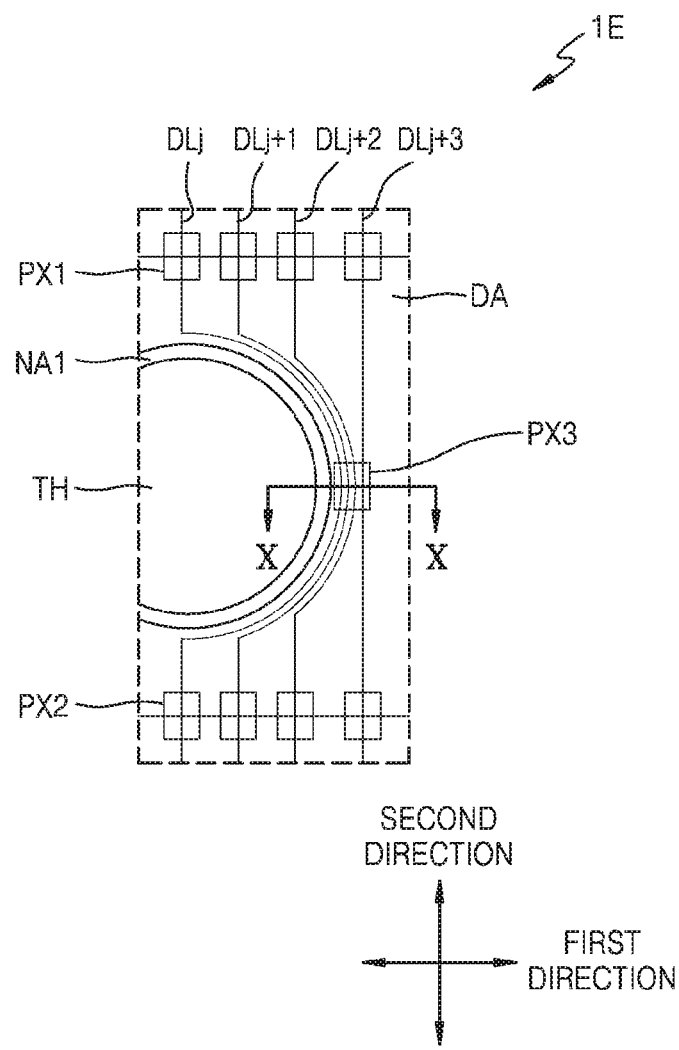
FIG. 11 is a plan view illustrating a portion of a display device according to another embodiment.
Figure 12:
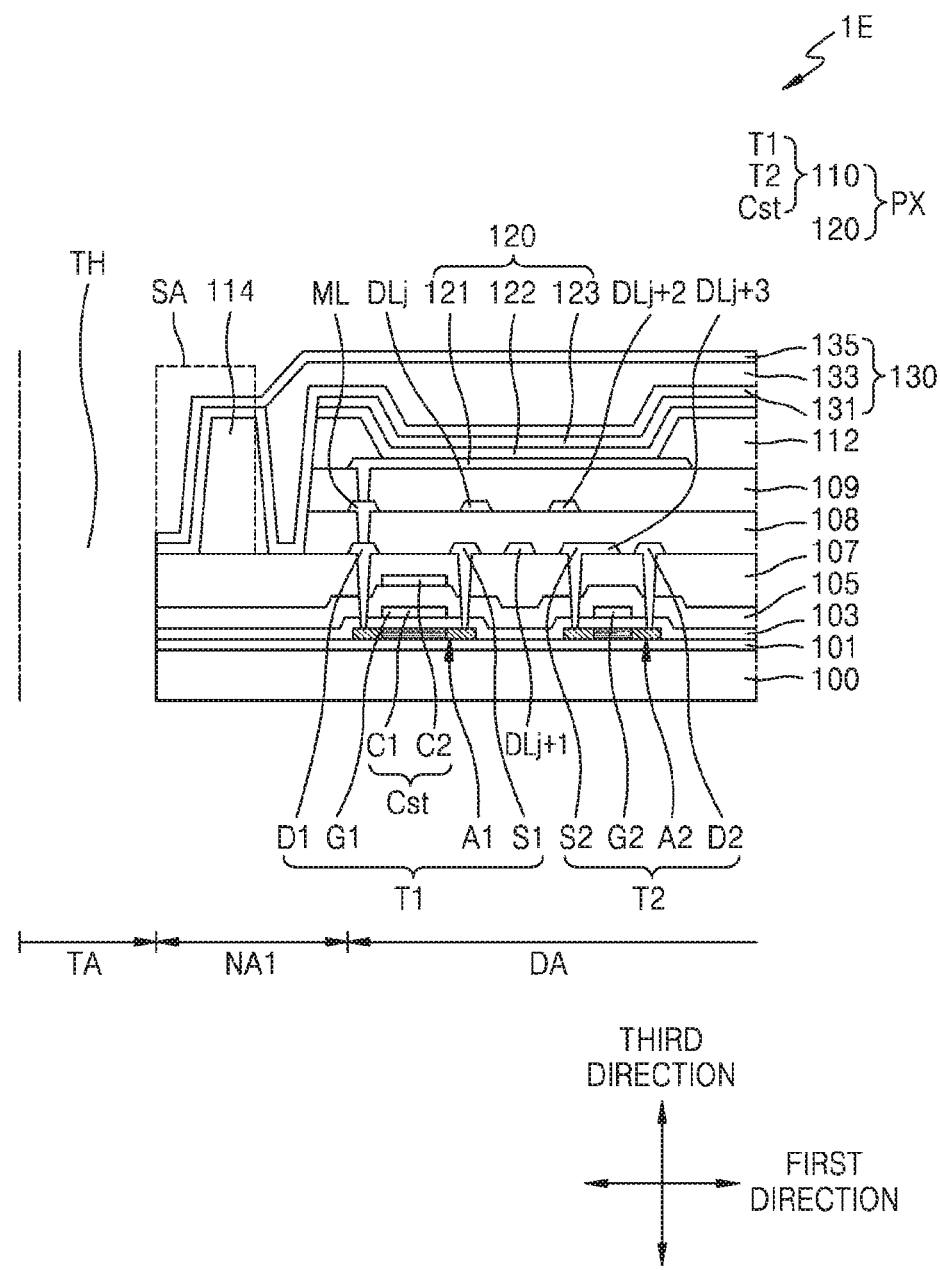
FIG. 12 is a cross-sectional view taken along the line X-X of FIG. 11.

FIG. 11 is a plan view illustrating a portion of a display device 1E according to another embodiment, and FIG. 12 is a cross-sectional view taken along the line X-X of FIG. 11. Compared with the display device 1A described with reference to FIGS. 6 and 7, the locations of the data lines DLj to DLj+2 of the display device 1E of FIGS. 11 and 12 are different. For convenience of description, points different from the embodiment described with reference to FIGS. 6 and 7 are mainly described.

Referring to FIGS. 11 and 12, the curved data lines DLj to DLj+2 are alternately located in different layers, but are located in the display area DA instead of the first non-display area NA1.

The curved data lines DLj to DLj+2 may apply a data signal to pixels PX1 and PX2 spaced apart from each other along the second direction with the through hole TH therebetween. The curved data lines DLj to DLj+2 may overlap the pixel electrode 121 of a third pixel PX3. The third pixel PX3 is connected to, and receives a data signal from, a data line DLj+3 that is spaced apart from the through hole TH and that extends in a straight line along the second direction. The data line DLj+3 connected to the third pixel PX3 is located at a same layer as the data line DLj+1.

Because the curved data lines DLj to DLj+2 overlap the pixel electrode 121 of the third pixel PX3 connected with the data line DLj+3 that is spaced apart from the through hole TH, the dam 114 may be located in relative isolation in the first non-display area NA1 of the substrate 100. Accordingly, an occupying ratio of, or a relative size of, the first non-display area NA1 in the substrate 100 may reduce.

Figure 13A:
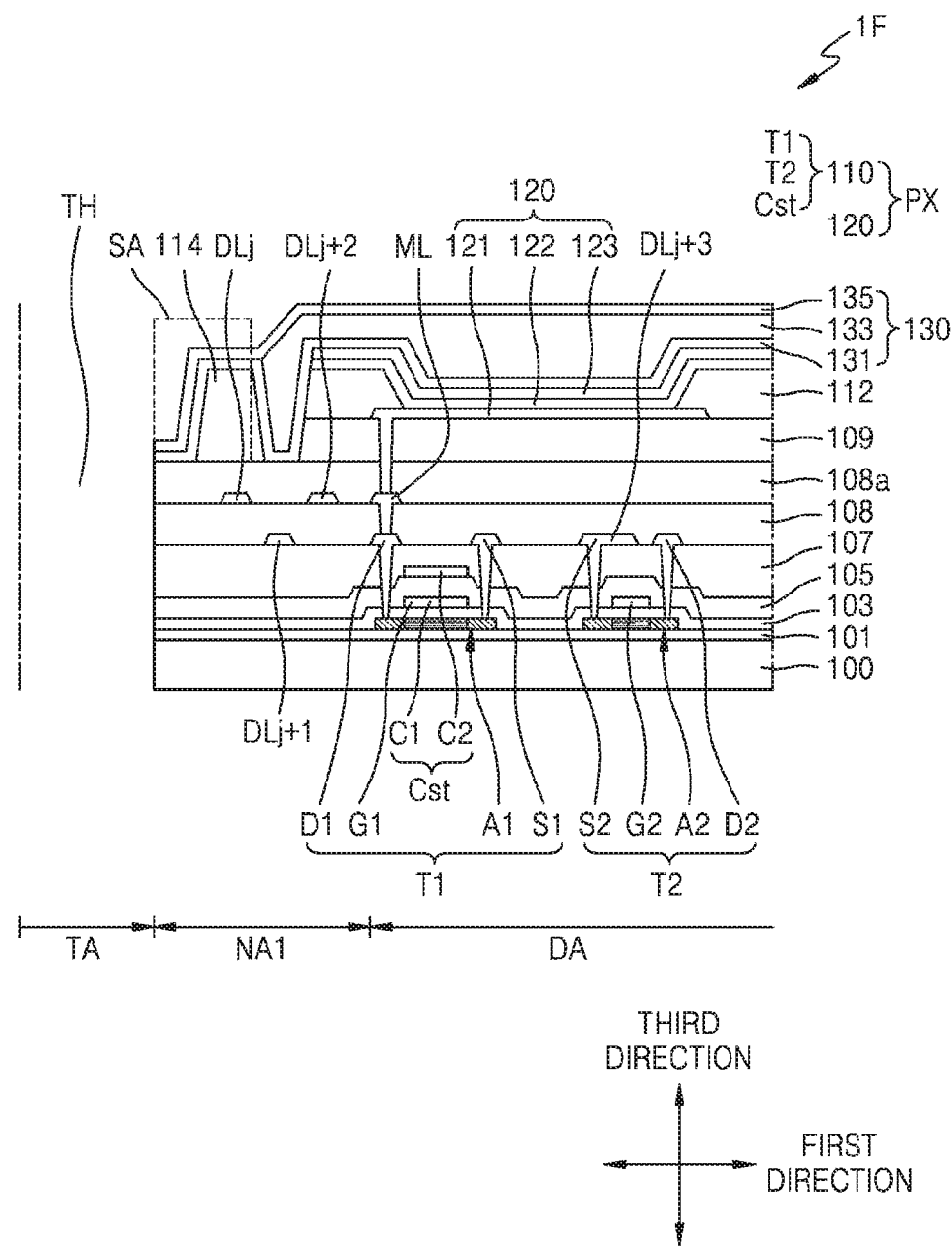
FIG. 13A is a cross-sectional view illustrating a portion of a display device according to another embodiment.

FIG. 13A is a cross-sectional view illustrating a portion of a display device 1F according to another embodiment. Compared with the display device 1A described with reference to FIGS. 6 and 7, the display device 1F of FIG. 13A further includes an inorganic passivation layer 108a covering the curved data lines DLj to DLj+2. Furthermore, a relation with the contact portion SA is different. For convenience of description, points different from the embodiment described with reference to FIGS. 6 and 7 are mainly described.

Referring to FIG. 13A, the inorganic passivation layer 108a is above the substrate 100 to cover the curved data lines DLj to DLj+2. The inorganic passivation layer 108a may include an inorganic material including an oxide or a nitride. For example, the inorganic passivation layer 108a may include SiOx, SiNx, SiON, Al2O3, TiO2, Ta2O5, HfO2, ZnO2, etc.

The curved data lines DLj and DLj+2 are covered with the inorganic passivation layer 108a while directly contacting the inorganic passivation layer 108a. The inorganic passivation layer 108a including an inorganic material has excellent moisture barrier performance compared with the planarization layer 109, which is an organic material. Therefore, even when a distance between the curved data lines DLj to DLj+2 and the through hole TH is reduced, barrier performance, or moisture penetration prevention performance, does not deteriorate. In this case, an occupying ratio of the first non-display area NA1 in the substrate 100 may be reduced without deteriorating the moisture penetration prevention performance.

As a distance between the curved data lines DLj to DLj+2 and the through hole TH reduces, at least one data line DLj, or a portion thereof, from among the curved data lines DLj to DLj+2 may overlap the dam 114 and a contact portion SA between the first inorganic layer 131 and the second inorganic layer 135.

Figure 13B:
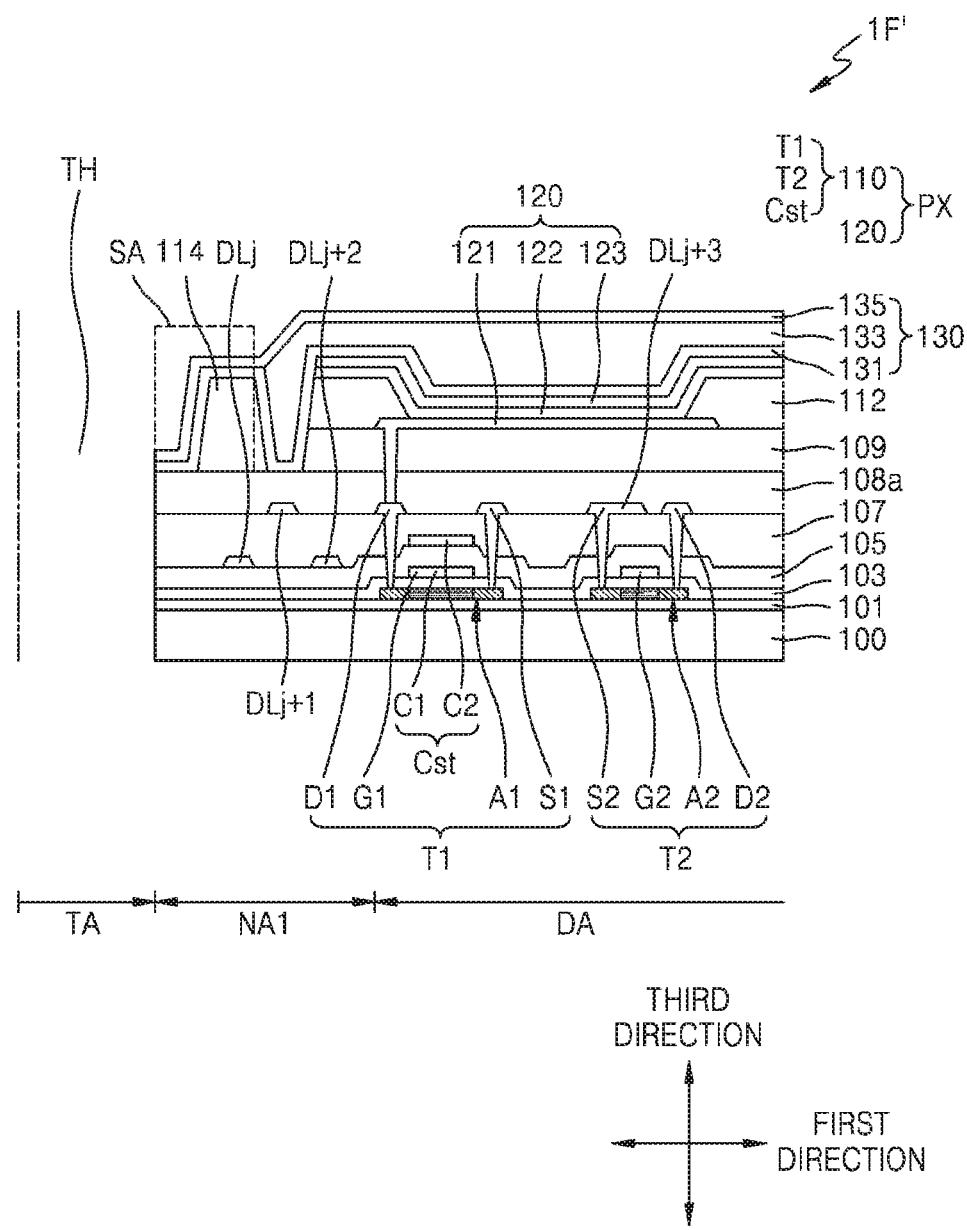
FIG. 13B is a cross-sectional view illustrating a portion of a display device according to another embodiment.

FIG. 13B is a cross-sectional view illustrating a portion of a display device 1F' according to another embodiment. Compared with the display device 1F described with reference to FIG. 13A, the structure and location of the curved data lines DLj to DLj+2 of the display device 1F' of FIG. 13B are different, and the organic passivation layer 108 is omitted. For convenience of description, points different from the embodiment described with reference to FIG. 13A are mainly described.

Referring to FIG. 13B, data line DLj+1 may at a same layer as, and may include the same material as, the source and drain electrodes S1 and D1 of the first thin film transistor T1. The other data lines DLj and DLj+2 may be at a same layer as, and may include the same material as, the upper electrode C2 of the storage capacitor Cst. Accordingly, a number of masks may be reduced.

Furthermore, because the inorganic passivation layer 108a covers the curved data lines DLj to DLj+2, as described with reference to FIG. 13A, an occupying ratio of the first non-display area NA1 in the substrate 100 may be reduced without deteriorating the moisture penetration prevention performance, as described above.

Figure 14A:
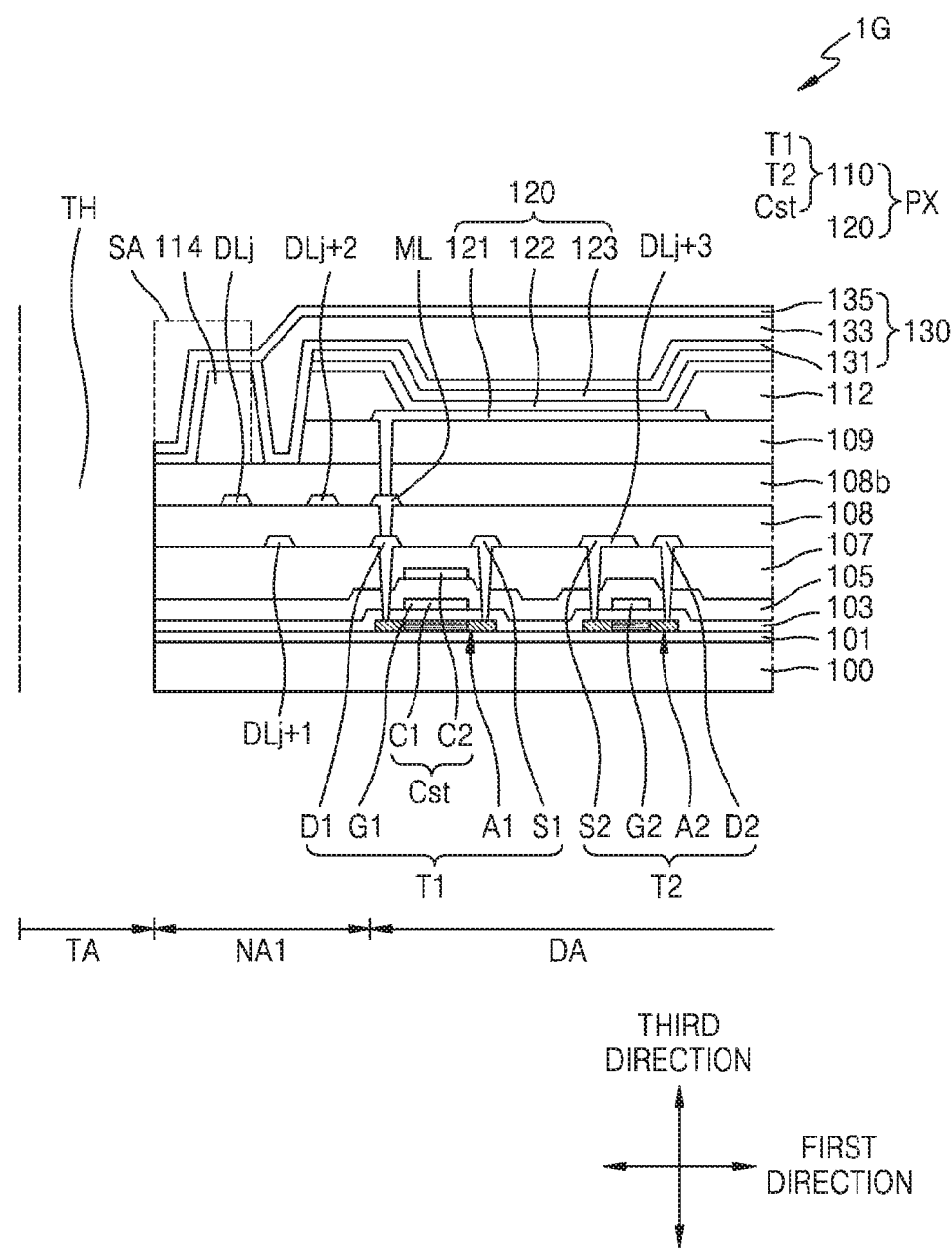
FIG. 14A is a cross-sectional view illustrating a portion of a display device according to another embodiment.

FIG. 14A is a cross-sectional view illustrating a portion of a display device 1G according to another embodiment. The display device 1G of FIG. 14A is a modified example of the display device 1F of FIG. 13A, and is different from the display device 1F of FIG. 13A in that the curved data lines DLj to DLj+2 are covered with, and directly contact, a passivation layer 108b including organic-inorganic composite particles instead of the inorganic passivation layer 108a.

The passivation layer 108b including organic-inorganic composite particles is an organic layer including acryl, polyolefin, polyimide (PI), polyurethane, polyethylene terephthalate (PET), polyethylene naphthalate (PEN), polybutylene terephthalate (PBT), polyethersulfone (PES), etc., and has a structure in which organic-inorganic composite particles are formed in a free volume of these organic layers. The passivation layer 108b including organic-inorganic composite particles may be formed by forming an organic layer, and by then performing a sequential vapor infiltration process.

The curved data lines DLj to DLj+2 are covered with, and directly contact, the passivation layer 108b including organic-inorganic composite particles. The inorganic passivation layer 108b including organic-inorganic composite particles has excellent moisture barrier performance when compared with the planarization layer 109, which is an organic material. Therefore, even when a distance between the curved data lines DLj to DLj+2 and the through hole TH is reduced, moisture penetration prevention performance is maintained. In this case, an occupying ratio of the first non-display area NA1 in the substrate 100 may be reduced without deteriorating the moisture penetration prevention performance.

As a distance between the curved data lines DLj to DLj+2 and the through hole TH decreases, at least one data line DLj from among the curved data lines DLj to DLj+2, or a portion thereof, may overlap the dam 114 and a contact portion SA between the first inorganic layer 131 and the second inorganic layer 135.

Figure 14B:
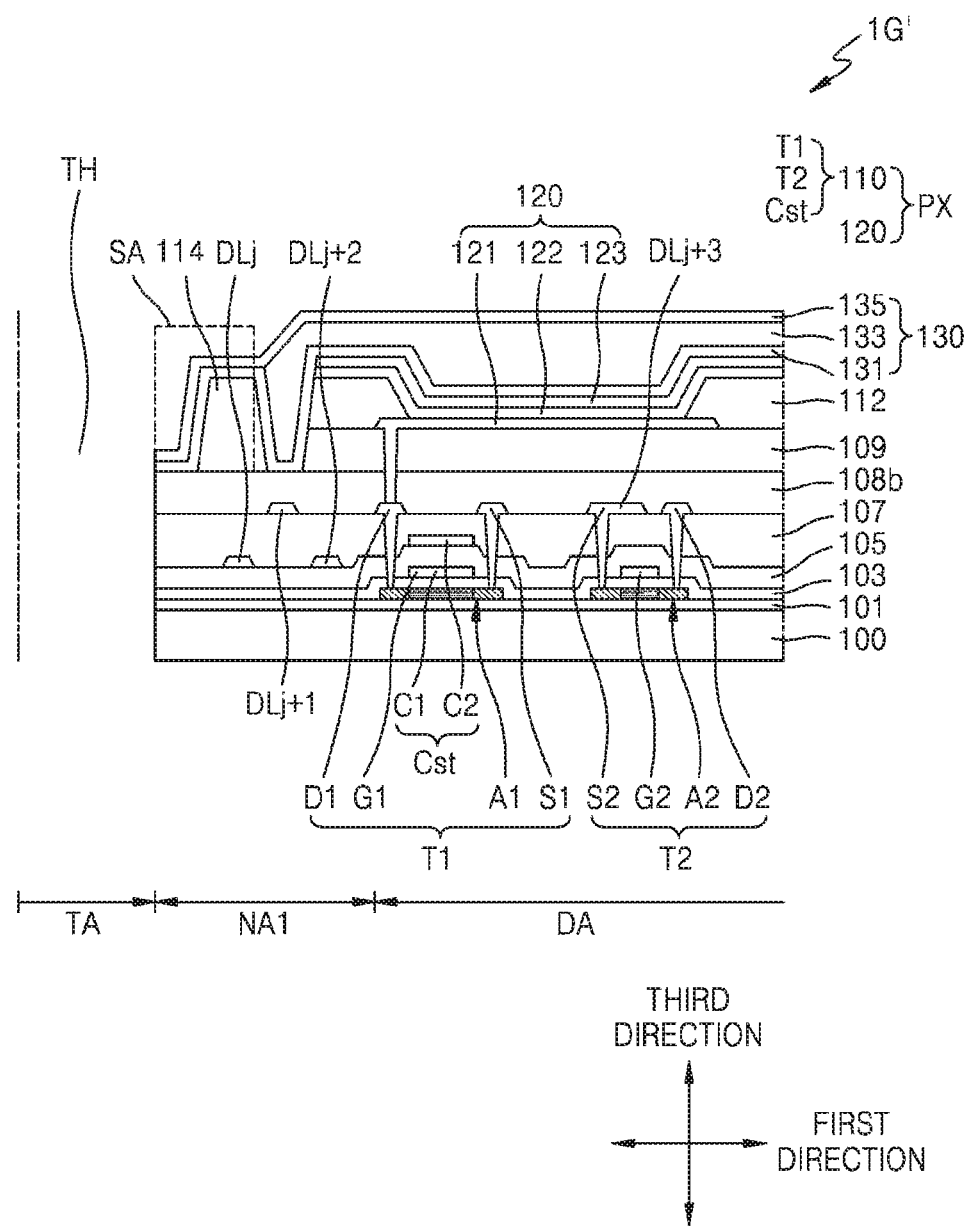
FIG. 14B is a cross-sectional view illustrating a portion of a display device according to another embodiment.

FIG. 14B is a cross-sectional view illustrating a portion of a display device 1G' according to another embodiment. Compared with the display device 1G described with reference to FIG. 14A, the structure and location of the curved data lines DLj to DLj+2 of the display device 1G' of FIG. 14B are different, and the organic passivation layer 108 is omitted. For convenience of description, points different from the embodiment described with reference to FIG. 14A are mainly described.

Referring to FIG. 14B, data line DLj+1 from among the curved data lines DLj to DLj+2 may be at a same layer as, and may include the same material as, the source and drain electrodes S1 and D1, and the other data lines DLj and DLj+2 of the curved data lines DLj to DLj+2 may be at a same layer as, and may include the same material as, the upper electrode C2 of the storage capacitor Cst. Accordingly, a number of masks may be reduced.

Furthermore, because the passivation layer 108b including organic-inorganic composite particles covers the curved data lines DLj to DLj+2, as described with reference to FIG. 14A, a size/occupying ratio of the first non-display area NA1 in the substrate 100 may be reduced without deteriorating the moisture penetration prevention performance as described above.

Figure 15A:
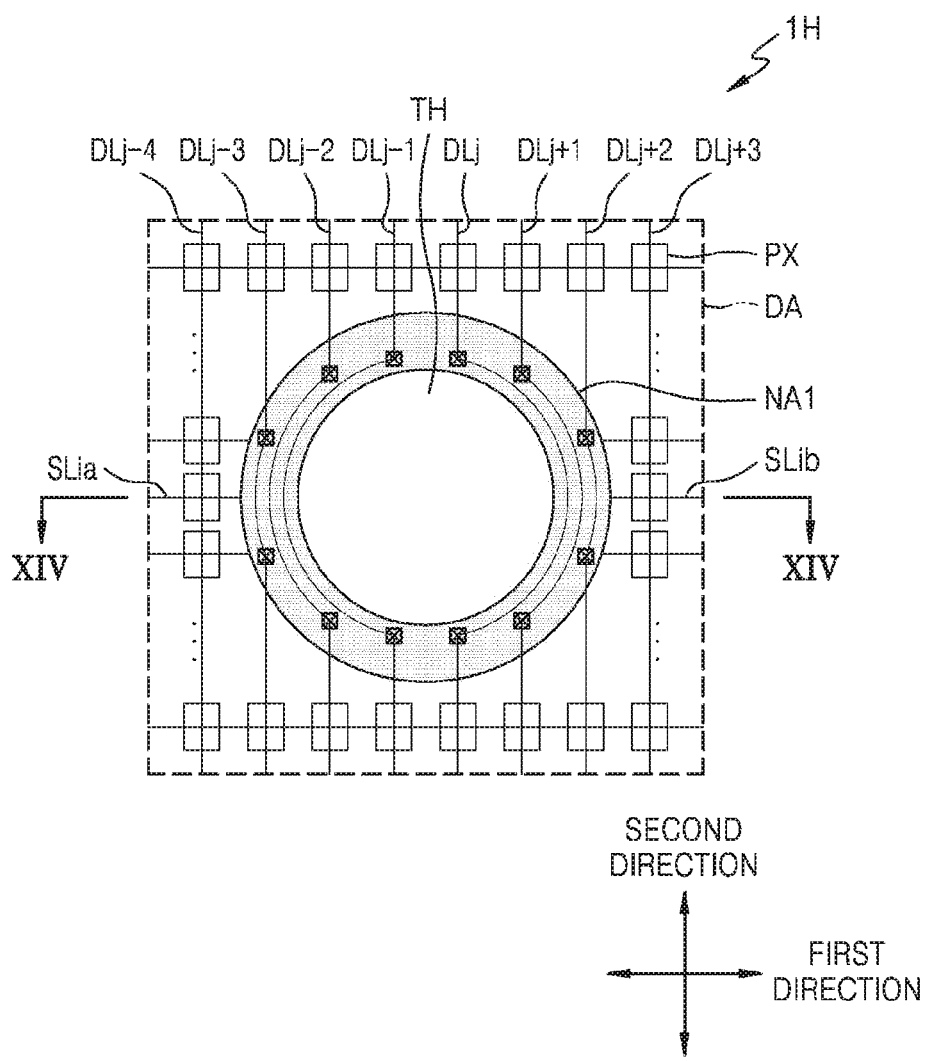
FIG. 15A is a plan view depicting a portion of a display device according to another embodiment.
Figure 15B:
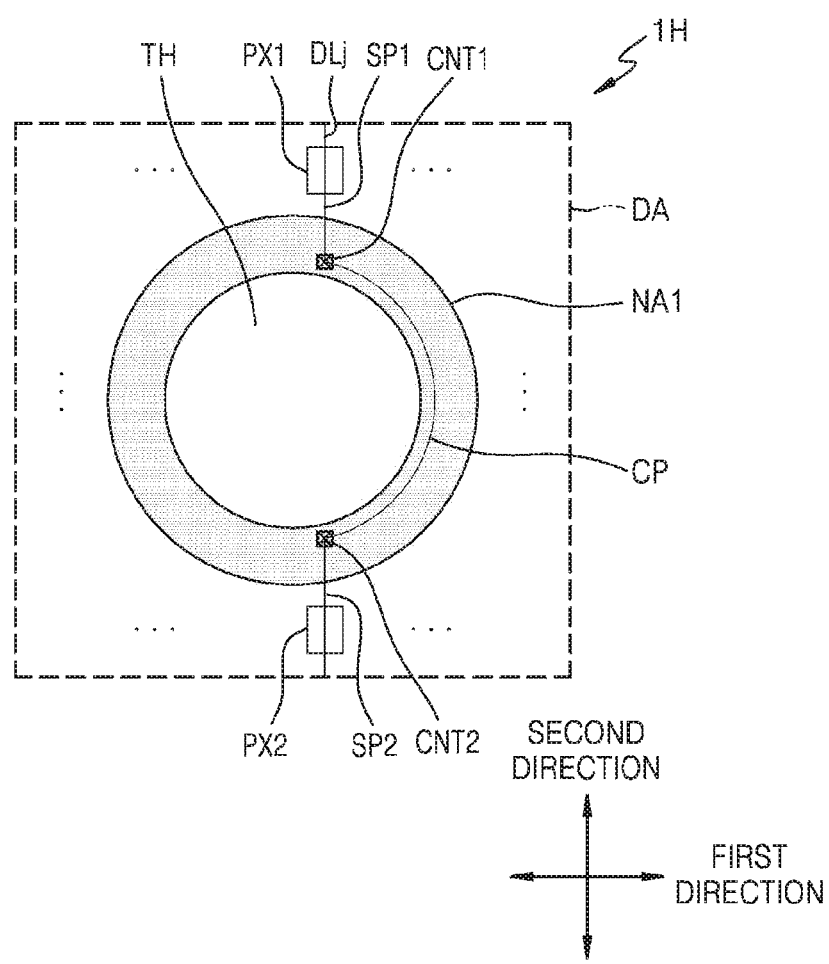
FIG. 15B is a plan view depicting a portion of FIG. 15A.
Figure 16:
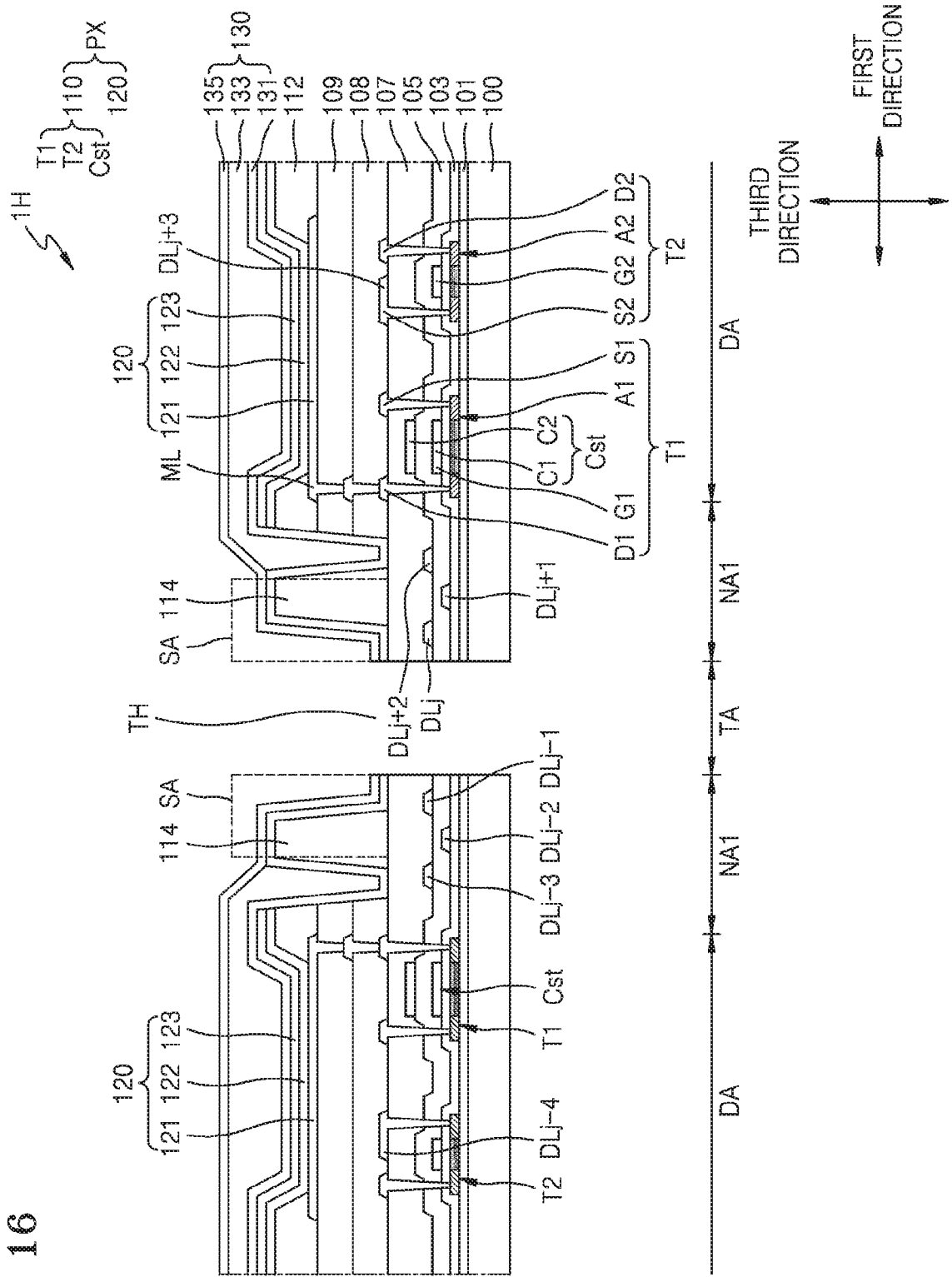
FIG. 16 is a cross-sectional view taken along the line XIV-XIV of FIG. 15A.

FIG. 15A is a plan view depicting a portion of a display device 1H according to another embodiment, FIG. 15B is a plan view depicting a portion of FIG. 15A, and FIG. 16 is a cross-sectional view taken along the line XIV-XIV of FIG. 15A.

The display device 1H of FIGS. 15A, 15B, and 16 is different from the display device 1 described with reference to FIGS. 3A, 3B, and 4, in that portions forming each of the curved data lines DLj−3 to DLj+2 are located in different layers. For convenience of description, points different from the embodiment described with reference to FIGS. 3A, 3B, and 4 are mainly described.

Referring to FIGS. 15A, 15B, and 16, the curved data lines DLj−3 to DLj+2 are alternately in different layers. However, as illustrated in FIG. 15B, a curved portion CP forming one data line DLj is at a different layer than first and second straight line portions SP1 and SP2. The first straight line portion SP1 is connected with the curved portion CP via a first contact hole CNT1, and the second straight line portion SP2 is connected with the curved portion CP via a second contact hole CNT2.

First and second straight line portions SP1 and SP2 of each of the curved data lines DLj−3 to DLj+2 may be above and below the organic passivation layer 108. According to an embodiment, the first and second straight line portions SP1 and SP2 of each of data lines DLj−2 and DLj+1 may at the same layer as the source and drain electrodes S1, S2, D1, D2 located below the organic passivation layer 108. The first and second straight line portions SP1 and SP2 of the other data lines DLj−3, DLj−1, DLj, and DLj+2 may be at a layer between the pixel electrode 121 and the source and drain electrodes S1, S2, D1, D2 located above the organic passivation layer 108.

Meanwhile, as illustrated in FIG. 16, a curved portion CP of the data lines DLj−2 and DLj+1 may be at a same layer as the lower electrode C1 of the storage capacitor Cst, and a curved portion CP of each of the other data lines DLj−3, DLj−1, DLj, and DLj+2 may at a same layer as the upper electrode C2 of the storage capacitor Cst.

As illustrated in FIG. 16, in the case where the curved portions CP are alternately in the layer in which the upper and lower electrodes C1 and C2 of the storage capacitor Cst are, the relevant data lines DLj−3 to DLj+2 are covered with the second interlayer insulating layer 107, which is an inorganic layer, while directly contacting the second interlayer insulating layer 107. The second interlayer insulating layer 107, which is an inorganic layer, has excellent moisture barrier performance. Therefore, even when a spaced distance between the curved data lines DLj−3 to DLj+2 and the through hole TH is reduced, the moisture penetration prevention performance is maintained. In this case, an occupying ratio of the first non-display area NA1 in the substrate 100 may reduce without deteriorating the moisture penetration prevention performance.

In an embodiment, at least partial data lines DLj−2, DLj−1, DLj, DLj+2 from among the curved data lines DLj−3 to DLj+2 may overlap the dam 114 and the contact portion SA.

Figure 17A:
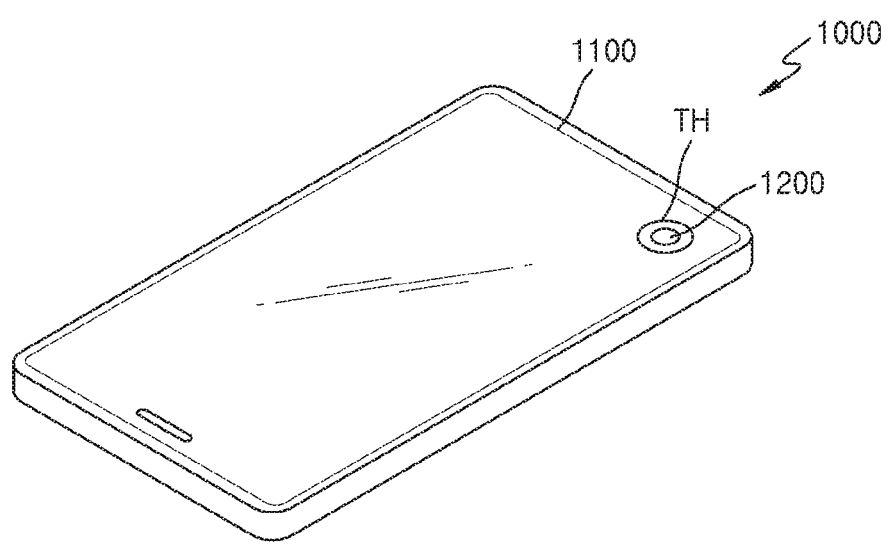
FIGS. 17A to 17C are views illustrating electronic apparatuses having a display device according to an embodiment.
Figure 17B:
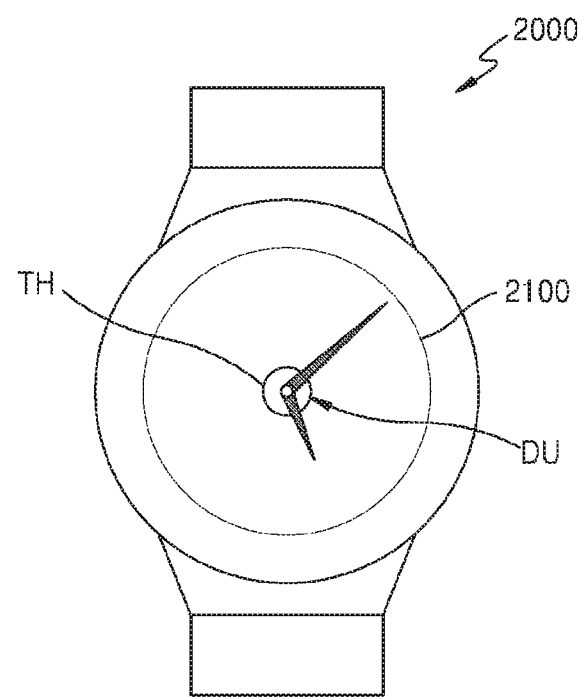
Figure 17C:
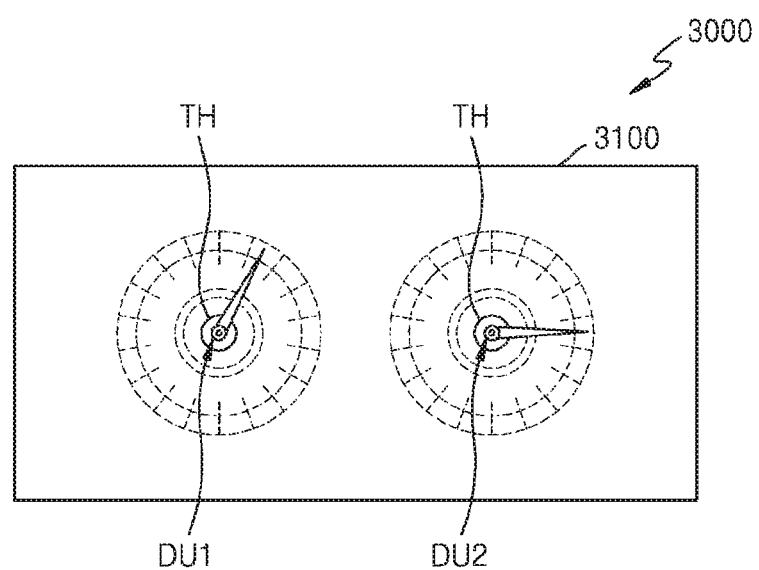

FIGS. 17A to 17C are views illustrating electronic apparatuses having a display device according to an embodiment.

Referring to FIG. 17A, a display device according to the above embodiments may be provided to a mobile phone 1000. A pixel array of the display device according to the above embodiments may form a display 1100 of the mobile phone 1000, and a part 1200, such as a camera, may be located inside the through hole TH.

The location of the through hole TH is not limited to the location illustrated in FIG. 17A. For example, in another embodiment, the through hole TH may be formed in the lower central portion of the display of the mobile phone 1000. In this case, a button may be located inside the through hole TH.

Referring to FIG. 17B, a display device according to the above embodiments may be provided to a smart watch 2000. A pixel array of the display device according to the above embodiments may form a display 2100 of the smart watch 2000, and a driving part DU, which may include a minute hand and an hour hand, may be located inside the through hole TH.

Referring to FIG. 17C, a display device according to the above embodiments may be provided to a dashboard 3000 for a vehicle. A pixel array of the display device according to the above embodiments may form a display 3100 of the dashboard 3000 for a vehicle, and the through hole TH may be provided in plural.

According to an embodiment, a first driving part DU1 including a hand indicating revolutions per minute (RPM), and a second driving part DU2 including a hand indicating a velocity, may be provided to through holes TH, respectively.

Although the inventive concept has been described with reference to exemplary embodiments illustrated in the drawings, these are provided for an exemplary purpose only, and one of ordinary skill in the art will understand that various modifications and other equivalent embodiments may be made therein. Therefore, the spirit and scope of the inventive concept should be defined by the following claims and their functional equivalents.

What is claimed is:

1. A display device comprising:
    a substrate having a front surface and a rear surface, the substrate having a through hole passing from the front surface to the rear surface;
    a plurality of pixels on the front surface of the substrate, the plurality of pixels being arranged in a display area around the through hole;
    a plurality of scan lines extending along a first direction in the display area and providing scan signals to the plurality of pixels;
    a plurality of data lines extending along a second direction crossing the first direction in the display area and providing data signals to the plurality of pixels, the plurality of data lines comprising a first data line and a second data line each including a curved section that is curved along a perimeter of the through hole;
    an insulation layer interposed between the curved section of the first data line and the curved section of the second data line;
    a dam in a non-display area between the display area and the through hole; and
    an encapsulation layer on the plurality of pixels and including at least one inorganic layer and an organic layer,
    wherein the curved sections of the first and second data lines are between the display area and the dam in the non-display area.

2. The device of claim 1, wherein the at least one inorganic layer of the encapsulation layer comprises a first inorganic layer and a second inorganic layer, and
    the organic layer of the encapsulation layer is between the first inorganic layer and the second inorganic layer.

3. The device of claim 2, wherein edges of the first and second inorganic layers are closer to the through hole than to an edge of the organic layer.

4. The device of claim 3, wherein the first and second inorganic layers are in direct contact with each other around the through hole.

5. The device of claim 2, wherein edges of the first and second inorganic layers correspond to an edge of the substrate which defines the through hole.

6. The device of claim 2, wherein the curved sections of the first and second data lines are covered by the first inorganic layer, the organic layer, and the second inorganic layer of the encapsulation layer.

7. The device of claim 1, wherein at least one selected from the first and the second data lines comprises:
    a first portion in the display area; and
    a second portion in the non-display area and comprising the curved section along the perimeter of the through hole,
    wherein the first portion and the second portion are connected to each other via a contact hole in the insulation layer.

8. The device of claim 7, wherein the contact hole in the insulation layer is located in the non-display area.

9. The device of claim 1, wherein the curved sections of the first and second data lines do not overlap each other.

10. The device of claim 1, wherein:
    each of the plurality of pixels comprises a first electrode, a second electrode, and an intermediate layer between the first electrode and the second electrode, and
    the intermediate layer overlaps at least one selected from the first and second data lines in the non-display area.

11. The device of claim 10, wherein the intermediate layer comprises at least one selected from an organic emission layer, a hole transport layer, a hole injection layer, an electron transport layer, and an electron injection layer.

12. A display device comprising:
    a substrate having a front surface and a rear surface, the substrate having a through hole passing from the front surface to the rear surface;

a plurality of pixels on the front surface of the substrate, the plurality of pixels being arranged in a display area around the through hole;

a plurality of scan lines extending along a first direction in the display area and providing scan signals to the plurality of pixels;

a plurality of data lines extending along a second direction crossing the first direction in the display area and providing data signals to the plurality of pixels, the plurality of data lines comprising a first data line and a second data line each including a curved section that is curved along a perimeter of the through hole in a non-display area;

an insulation layer interposed between the curved section of the first data line and the curved section the second data line;

a dam in the non-display area between the display area and the through hole; and an encapsulation layer on the plurality of pixels and including at least one inorganic layer and an organic layer, wherein the curved sections of the first and second data lines are covered by the at least one inorganic layer and the organic layer.

13. The device of claim 12, wherein the curved sections of the first and second data lines are between the display area and the dam in the non-display area.

14. The device of claim 12, wherein an edge of the at least one inorganic layer is closer to the through hole than to an edge of the organic layer.

15. The device of claim 14, wherein:

the at least one inorganic layer of the encapsulation layer comprises a first inorganic layer and a second inorganic layer with the organic layer therebetween, and the first and second inorganic layers are in direct contact with each other around the through hole.

16. The device of claim 15, wherein the edges of the first and second inorganic layers correspond to an edge of the substrate which defines the through hole.

17. The device of claim 12, wherein at least one selected from the first and the second data lines comprises:

a first portion in the display area; and a second portion in the non-display area and comprising the curved section along the perimeter of the through hole, wherein the first portion and the second portion are connected to each other via a contact hole in the insulation layer.

18. The device of claim 17, wherein the contact hole in the insulation layer is located in a region of the non-display area between the display area and the dam.

19. The device of claim 12, wherein the curved sections of the first and second data lines do not overlap each other.

20. The device of claim 12, wherein:

each of the plurality of pixels comprises a first electrode, a second electrode, and an intermediate layer between the first electrode and the second electrode, and the intermediate layer overlaps at least one selected from the first and second data lines in the non-display area.

* * * * *